(12) United States Patent
Machida

(10) Patent No.: US 10,876,799 B2
(45) Date of Patent: Dec. 29, 2020

(54) LOOP HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 42 days.

(21) Appl. No.: 16/299,530

(22) Filed: Mar. 12, 2019

(65) Prior Publication Data

US 2019/0293362 A1 Sep. 26, 2019

(30) Foreign Application Priority Data

Mar. 26, 2018 (JP) .................. 2018-058932

(51) Int. Cl.
*F28D 15/04* (2006.01)
*H01L 23/427* (2006.01)
(Continued)

(52) U.S. Cl.
CPC ....... *F28D 15/043* (2013.01); *F28D 15/0233* (2013.01); *F28D 15/0266* (2013.01); *F28D 15/046* (2013.01); *H01L 23/427* (2013.01); *H01L 23/467* (2013.01); *H01L 23/473* (2013.01); *F28D 15/02* (2013.01);
(Continued)

(58) Field of Classification Search
CPC . H01L 23/3735; H01L 23/427; H01L 23/467; H01L 23/473; F28D 15/02; F28D 15/233; F28D 15/0266; F28D 15/045; F28D 15/043; F28D 15/025; F28D 2021/0028; F28D 15/0233; F28D 15/046; F28F 1/006;
(Continued)

(56) References Cited

U.S. PATENT DOCUMENTS 6,719,040 B2 * 4/2004 Sugito ................. F28D 15/0266
165/104.21
2003/0079863 A1 * 5/2003 Sugito .................. F28F 13/187
165/104.21
(Continued)

FOREIGN PATENT DOCUMENTS

CA 2853969 A1 * 5/2013 ........... F28D 9/0075
DE 1913424 A1 * 9/1970 ............ B01D 3/166
(Continued)

*Primary Examiner* — Len Tran
*Assistant Examiner* — Jenna M Hopkins
(74) *Attorney, Agent, or Firm* — IPUSA, PLLC

(57) ABSTRACT

A loop heat pipe includes a liquid pipe and a vapor pipe that connect an evaporator and a condenser and form a loop-shaped passage. The liquid pipe includes two outermost metal layers, and inner metal layers stacked between the outer metal layers. The inner metal layers include one or more flow passages in which a working fluid flows, and a porous body communicating with the one or more flow passages. One inner metal layer includes a first bottomed groove opening to a side of another inner metal layer adjacent to the one inner metal layer, and the other inner metal layer includes a second bottomed groove opening to a side of the one inner metal layer. The one or more flow passages include a flow passage formed by the first and second bottomed grooves that are arranged to oppose and communicate with each other in a thickness direction.

17 Claims, 13 Drawing Sheets

(51) Int. Cl.
   *H01L 23/467* (2006.01)
   *F28D 15/02* (2006.01)
   *H01L 23/473* (2006.01)
   *F28D 21/00* (2006.01)
   *H01L 23/373* (2006.01)
   *H05K 7/20* (2006.01)

(52) U.S. Cl.
   CPC .... *F28D 15/025* (2013.01); *F28D 2021/0028* (2013.01); *H01L 23/3735* (2013.01); *H05K 7/20336* (2013.01)

(58) Field of Classification Search
   CPC .. F28F 1/025; H05K 7/20336; H05K 7/20663
   See application file for complete search history.

(56) References Cited

U.S. PATENT DOCUMENTS

| | | | | |
|---|---|---|---|---|
| 2005/0022978 A1* | 2/2005 | Duval | ............... | F28D 15/0233 165/104.26 |
| 2006/0157227 A1* | 7/2006 | Choi | ............... | H01L 23/427 165/104.21 |
| 2009/0020274 A1* | 1/2009 | Kawabata | ............... | F28D 15/0233 165/168 |
| 2009/0323285 A1* | 12/2009 | Ryoson | ............... | H01L 23/427 361/700 |
| 2010/0122798 A1* | 5/2010 | Hashimoto | ............... | F28F 21/02 165/104.21 |
| 2010/0326632 A1* | 12/2010 | Nagai | ............... | F28F 3/086 165/104.26 |
| 2012/0181005 A1* | 7/2012 | Downing | ............... | F28F 3/086 165/166 |
| 2016/0259383 A1* | 9/2016 | Shioga | ............... | G06F 1/203 |
| 2017/0299239 A1* | 10/2017 | Steven | ............... | F25B 39/00 |
| 2018/0058767 A1* | 3/2018 | Machida | ............... | F28D 15/0266 |
| 2018/0087842 A1* | 3/2018 | Chainer | ............... | H01L 23/473 |
| 2018/0142960 A1* | 5/2018 | Kurashima | ............... | H01L 23/427 |
| 2018/0164043 A1* | 6/2018 | Kurashima | ............... | F28D 15/04 |
| 2018/0180360 A1* | 6/2018 | Katoh | ............... | F28D 15/0283 |
| 2018/0306521 A1* | 10/2018 | Machida | ............... | F28D 15/0266 |
| 2019/0162481 A1* | 5/2019 | Machida | ............... | F28D 15/043 |
| 2019/0227607 A1* | 7/2019 | Machida | ............... | F28D 15/0266 |
| 2019/0239395 A1* | 8/2019 | Joshi | ............... | H01L 23/427 |
| 2019/0242652 A1* | 8/2019 | Machida | ............... | F28D 15/043 |
| 2019/0242654 A1* | 8/2019 | Machida | ............... | F28D 15/0233 |
| 2019/0285354 A1* | 9/2019 | Machida | ............... | H01L 23/3736 |
| 2020/0025458 A1* | 1/2020 | Takahashi | ............... | F28F 3/12 |
| 2020/0049417 A1* | 2/2020 | Machida | ............... | F28D 15/0233 |
| 2020/0049419 A1* | 2/2020 | Machida | ............... | F28D 15/04 |
| 2020/0096261 A1* | 3/2020 | Tanaka | ............... | F28D 15/043 |
| 2020/0124353 A1* | 4/2020 | Machida | ............... | F28D 15/043 |

FOREIGN PATENT DOCUMENTS

| | | | | | |
|---|---|---|---|---|---|
| DE | 4238191 | A1 | * | 5/1994 | ............ F28F 21/04 |
| EP | 0611235 | A1 | * | 8/1994 | ............ F28F 3/086 |
| EP | 2476987 | A2 | | 7/2012 | ........ F28D 15/0266 |
| EP | 3521743 | A1 | * | 8/2019 | ............ F28D 15/046 |
| EP | 3531056 | A1 | * | 8/2019 | ............... F28F 3/12 |
| EP | 3594599 | A1 | * | 1/2020 | ............ F28D 15/04 |
| FR | 991096 | A | * | 10/1951 | ............ F28F 3/086 |
| FR | 2752927 | A1 | * | 3/1998 | ............ F28F 3/086 |
| JP | 2002327993 | A | * | 11/2002 | ........ H01L 21/4882 |
| JP | 6146484 | | | 6/2017 | |
| JP | 6400240 | B1 | * | 10/2018 | ............ F28D 15/043 |
| WO | WO-2009037928 | A1 | * | 3/2009 | ............ F28D 15/046 |
| WO | WO-2011018213 | A1 | * | 2/2011 | ............ B01F 13/0059 |
| WO | WO-2015087451 | A1 | * | 6/2015 | ............ G06F 1/203 |
| WO | WO-2017047825 | A1 | * | 3/2017 | ............ H01L 23/473 |
| WO | WO-2018012558 | A1 | * | 1/2018 | ........ H05K 7/20254 |
| WO | WO-2019106762 | A1 | * | 6/2019 | ............ F28D 15/04 |

* cited by examiner

LOOP HEAT PIPE

CROSS-REFERENCE TO RELATED APPLICATION

This application is based upon and claims priority to Japanese Patent Application No. 2018-058932, filed on Mar. 26, 2018, the entire contents of which are incorporated herein by reference.

FIELD

Certain aspects of the embodiments discussed herein are related to a loop heat pipe, and a method of manufacturing the loop heat pipe.

BACKGROUND

A heat pipe is a known device for cooling a heat-generating component, such as a CPU (Central Processing Unit) or the like, that is provided in electronic devices. The heat pipe utilizes a phase change of a working fluid to transfer heat.

For example, a proposed heat pipe includes a flow passage that is formed by stacking a plurality of metal layers. This proposed heat pipe includes a column that is formed by a plurality of metal layers and is provided within the flow passage, in order to prevent deformation of the flow passage caused by pressing or the like performed with respect to plurality of metal layers during a manufacturing process.

Japanese Patent No. 6146484 (International Publication Pamphlet No. WO 2015/087451) proposes an example of the heat pipe.

However, when providing the column, that is formed by the plurality of metal layers, within the flow passage, a hanger is always required to provide a contact with a pipe wall at a predetermined position. Providing the hanger not only inhibits the degree of freedom of design of each metal layer, but also reduces space that becomes the flow passage. When the flow passage becomes narrow, a pressure loss, that is an energy loss when the working fluid flows within the flow passage, becomes large. This pressure loss inhibits the flow of the working fluid, to greatly deteriorate a heat transfer performance of the heat pipe.

SUMMARY

Accordingly, it is an object in one aspect of the embodiments to provide a loop heat pipe, and a method of manufacturing the loop heat pipe, which can reduce the deterioration in the heat transfer performance of the loop heat pipe.

According to one aspect of the embodiments, a loop heat pipe includes an evaporator configured to vaporize a working fluid; a condenser configured to liquefy the working fluid; a liquid pipe configured to connect the evaporator and the condenser; and a vapor pipe configured to connect the evaporator and the condenser and form a loop-shaped passage, wherein the liquid pipe includes a first metal layer and a second metal layer forming outermost layers, and two or more metal layers that form inner layers stacked between the outer layers, wherein the inner layers are provided with one or more flow passages in which the working fluid flows, and a porous body communicating with the one or more flow passages, wherein a third metal layer forming the inner layers includes a first bottomed groove opening to a side of a fourth metal layer forming the inner layers and adjacent to the third metal layer, wherein the fourth metal layer includes a second bottomed groove opening to a side of the third metal layer, and wherein the one or more flow passages include a flow passage formed by the first bottomed groove and the second bottomed groove that are arranged to oppose and communicate with each other in a thickness direction.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
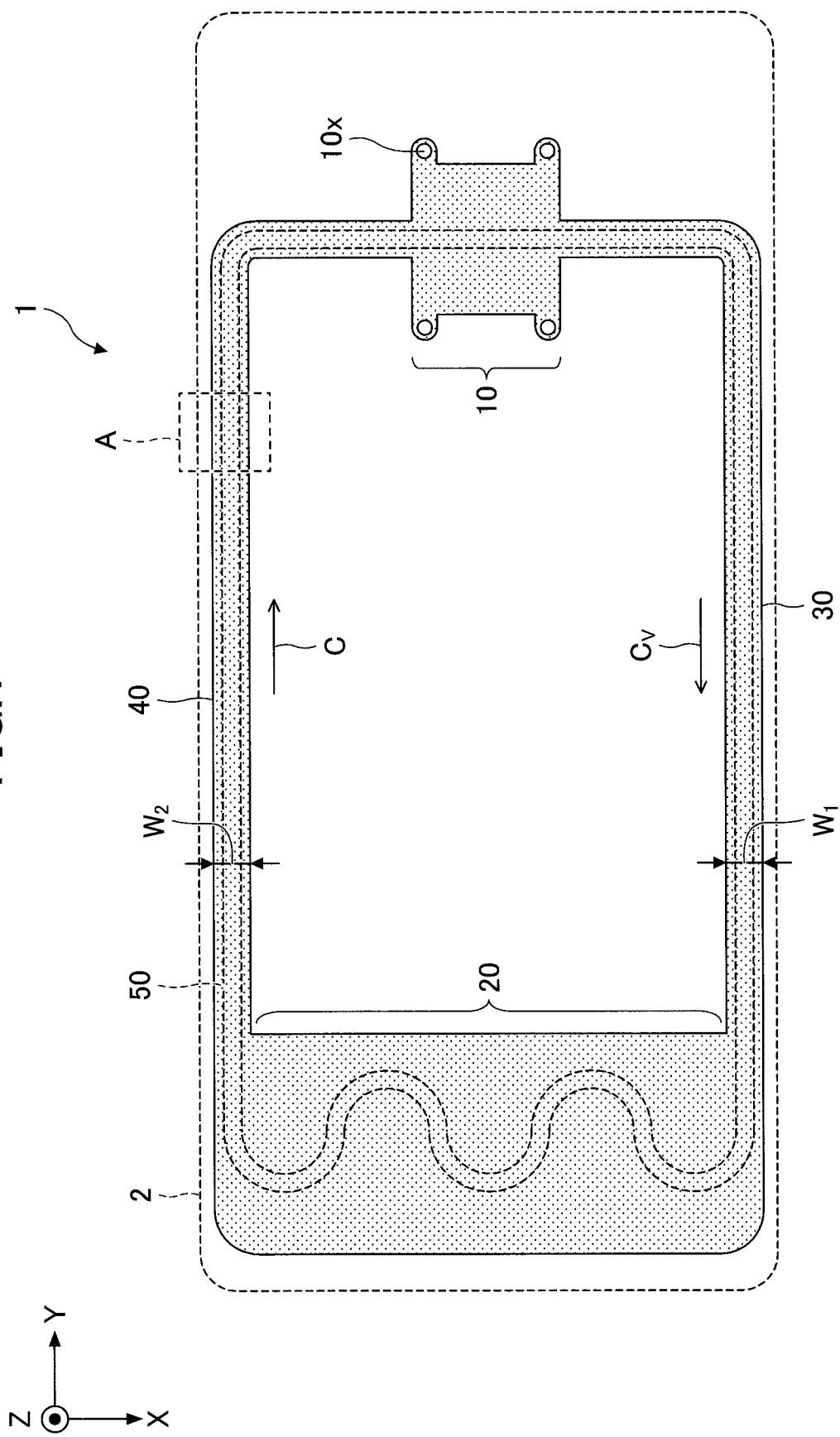
FIG. 1 is a plan view schematically illustrating an example of a loop heat pipe in a first embodiment.

Preferred embodiments of the present invention will be described with reference to the accompanying drawings. In the drawings, those parts that are the same are designated by the same reference numerals, and a repeated description of the same parts may be omitted.

A description will now be given of the loop heat pipe and the method of manufacturing the loop heat pipe in each embodiment according to the present invention.

First Embodiment

[Structure of Loop Heat Pipe in First Embodiment]

First, a description will be given of a structure of the loop heat pipe in a first embodiment. FIG. 1 is a plan view schematically illustrating an example of the loop heat pipe in a first embodiment.

As illustrated in FIG. 1, a loop heat pipe 1 includes an evaporator 10, a condenser 20, a vapor pipe 30, and a liquid pipe 40. The loop heat pipe 1 may be accommodated within a mobile electronic device 2, such as a smartphone, a tablet terminal, or the like, for example.

In FIG. 1, an X-direction indicates a longitudinal direction of the condenser 20, a Y-direction indicates a direction perpendicular to the X-direction in a plane of FIG. 1, and a Z-direction indicates a normal direction (thickness direction of the loop heat pipe 1) in the plane of FIG. 1.

In the loop heat pipe 1, the evaporator 10 has a function to vaporize a working fluid C and generate vapor Cv. The condenser 20 has a function to liquefy the vapor Cv of the working fluid C. The evaporator 10 and the condenser 20 are connected via the vapor pipe 30 and the liquid pipe 40, and the vapor pipe 30 and the liquid pipe 40 form a loop-shaped passage (or route) 50 in which the working liquid C or the vapor Cv flows. Although FIG. 1 illustrates the flow passage 50, the flow passage 50 is a generic term for the flow passage, and may actually be formed by various flow passages (for example, a flow passages 51 and 52, or the like) which will be described later.

Figure 2:
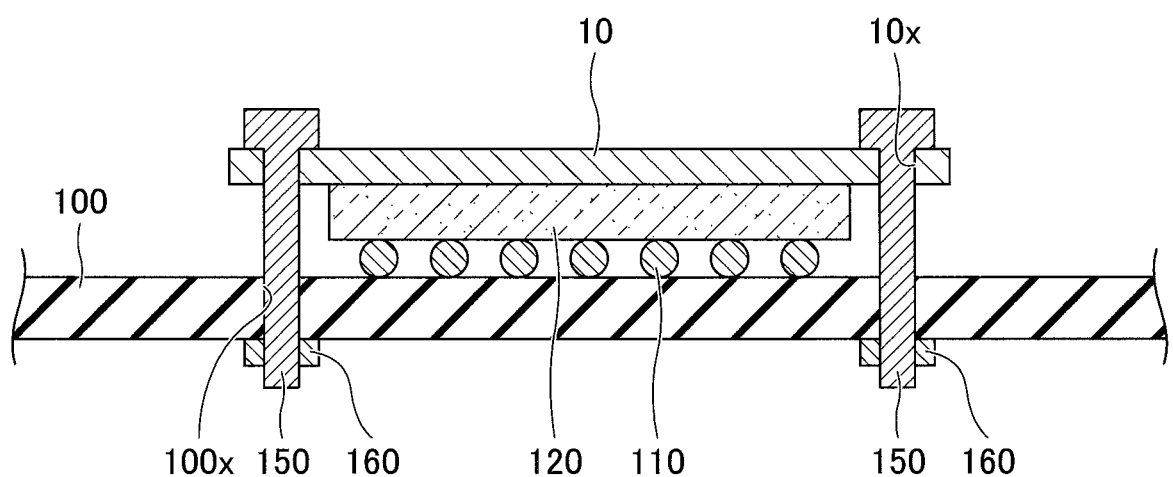
FIG. 2 is a cross sectional view of an evaporator and a periphery of the evaporator of the loop heat pipe in the first embodiment.

FIG. 2 is a cross sectional view of the evaporator and a periphery of the evaporator of the loop heat pipe in the first embodiment. As illustrated in FIG. 1 and FIG. 2, the evaporator 10 includes 4 through-holes 10x, for example. A bolt 150 is inserted into each through-hole 10x of the evaporator 10 and a corresponding through-hole 100x formed in a circuit board 100, and a tip of each bolt 150 is fastened by a nut 160 at a lower surface side of the circuit board 100 in FIG. 2, to fix the evaporator 10 on the circuit board 100.

A heat generating component 120, such as a CPU or the like, for example, is mounted on the circuit board 100 via bumps 110. An upper surface of the heat generating component 120 is bonded to a lower surface of the evaporator 10. The working fluid C inside the evaporator 10 is vaporized by the heat generated from the heat generating component 120, to generate the vapor Cv.

As illustrated in FIG. 1, the vapor Cv generated from the evaporator 10 passes through the vapor pipe 30 and is guided to the condenser 20, to be liquefied by the condenser 20. Hence, the heat generated from the heat generating component 120 is transferred to the condenser 20, to reduce a temperature rise of the heat generating component 120. The working fluid C, liquefied by the condenser 20, passes through the liquid pipe 40 and is guided to the evaporator 10. A width $W_1$ of the vapor pipe 30 may be approximately 8 mm, for example. In addition, a width $W_2$ of the liquid pipe 40 may be approximately 6 mm, for example.

The working fluid C is not limited to a particular type of fluid. From a viewpoint of efficiently cooling the heat generating component 120 by latent heat of vaporization, a fluid with a high vapor pressure and a large latent heat of vaporization is preferably used as the working fluid C. Examples of such a fluid, preferably used as the working fluid C, include ammonia, water, fluorocarbon, alcohol, and acetone, for example.

The evaporator 10, the condenser 20, the vapor pipe 30, and the liquid pipe 40 may have a structure that is formed by successively stacking a plurality of metal layers, for example. The metal layers are copper layers having a high thermal conductivity, for example, and the metal layers are directly bonded to each other by solid-phase (or solid-state) bonding or the like. Each of the metal layers may have a thickness of approximately 50 μm to approximately 200 μm, for example.

Of course, the metal layers are not limited to the copper layers, and may be stainless steel layers, aluminum layers, magnesium alloy layers, or the like, for example. In addition, the number of metal layers that are stacked is not limited to a particular number.

Figure 3A:
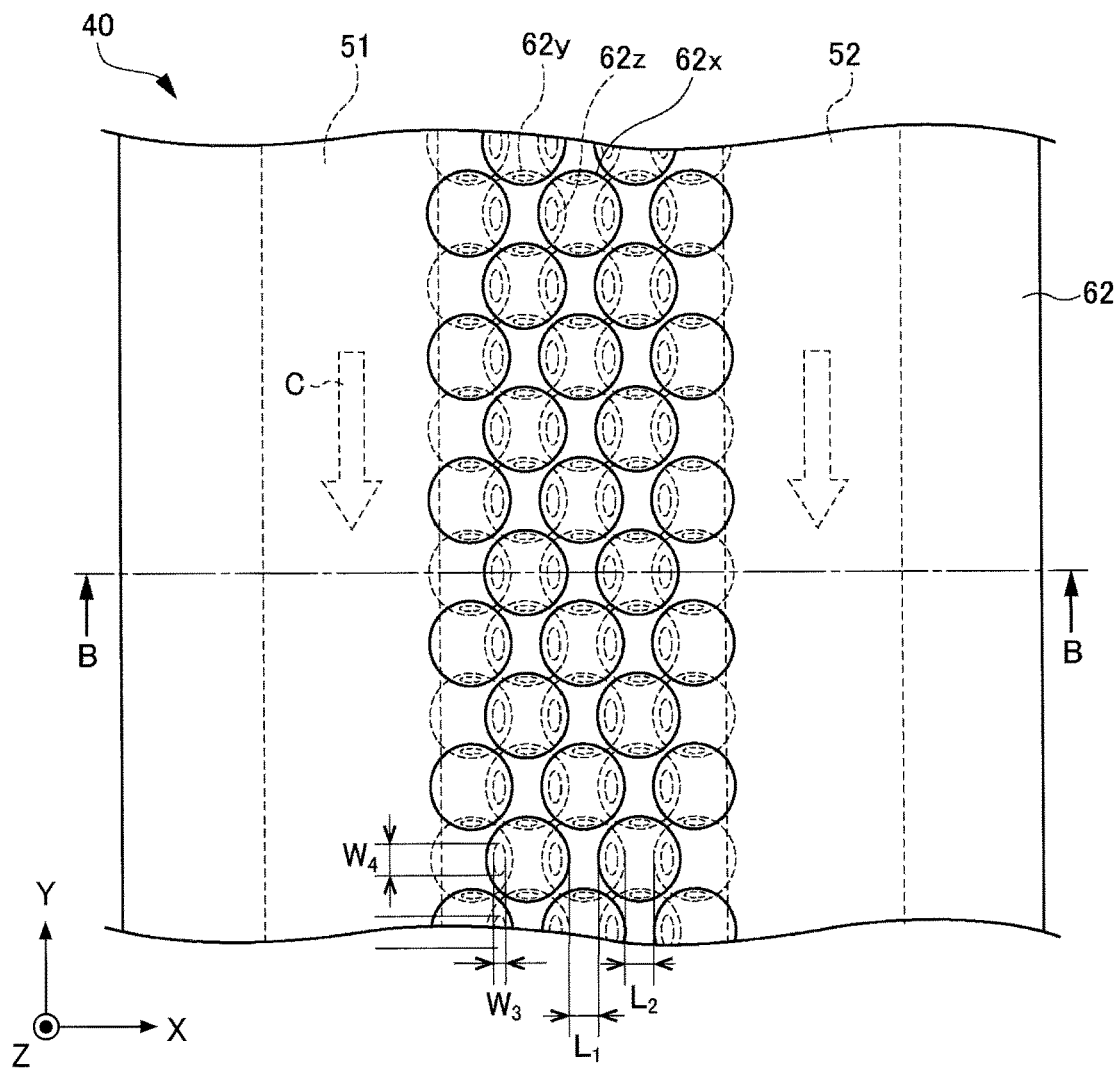
FIG. 3A and FIG. 3B are diagrams illustrating an example of a liquid pipe of the loop heat pipe in the first embodiment.
Figure 3B:
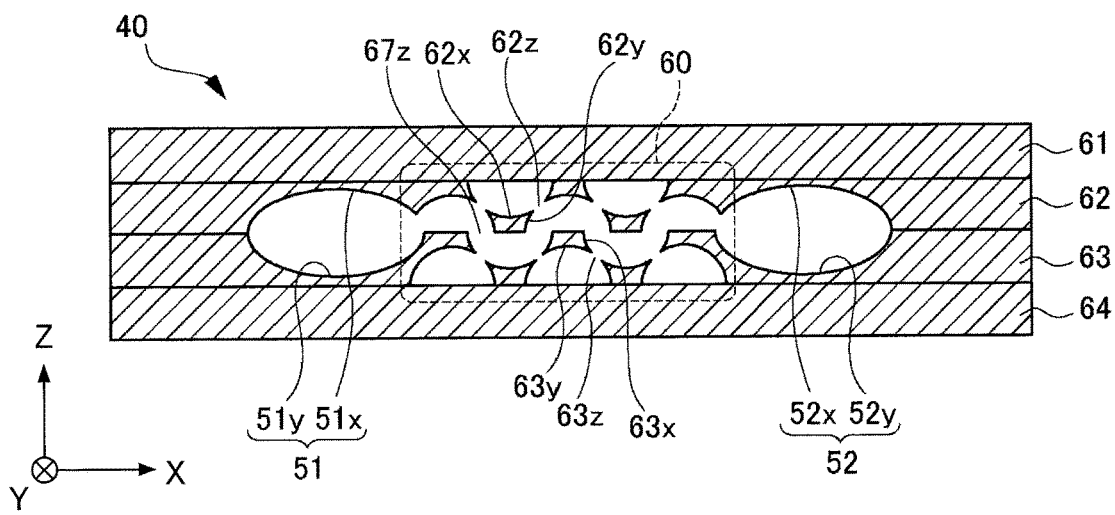

FIG. 3A and FIG. 3B are diagrams illustrating an example of the liquid pipe of the loop heat pipe in the first embodiment. FIG. 3A is a partial enlarged plan view of a part A illustrated in FIG. 1, and FIG. 3B is a cross sectional view along a line B-B in FIG. 3A. FIG. 3A illustrates a planar shape of a porous body 60 within the liquid pipe 40, and for this reason, the illustration of a metal layer (metal layer 61 illustrated in FIG. 3B) that becomes one of two outermost layers is omitted in FIG. 3A.

As illustrated in FIG. 3B, the liquid pipe 40 has a structure in which four metal layers 61 through 64 are successively stacked. In the liquid pipe 40, the metal layers 61 and 64 form the two outermost layers, and the metal layers 62 and 63 form inner layers. However, the liquid pipe may have a structure including two metal layers forming the two outermost layers, and two or more metal layers stacked between the two outermost layers and forming the inner layers. In other words, the inner layers of the liquid pipe may be formed by three or more metal layers.

The metal layers 61 through 64 are copper layers having a high thermal conductivity, for example, and the metal layers 61 through 64 are directly bonded to each other by solid-phase bonding or the like. Each of the metal layers 61 through 64 may have a thickness of approximately 50 μm to approximately 200 μm, for example. Of course, the metal layers 61 through 64 are not limited to the copper layers, and may be stainless steel layers, aluminum layers, magnesium alloy layers, or the like, for example. In addition, the number of metal layers that are stacked is not limited to four, and the number of metal layers that are stacked may be five or more.

The flow passages 51 and 52, and the porous body 60 communicating with the flow passages 51 and 52, are provided in the inner layers (the metal layers 62 and 63) of the liquid pipe 40. The flow passage 51 is provided on the side of one end of the porous body 60 along the X-direction, and the flow passage 52 is provided on the side of the other end of the porous body 60 along the X-direction. In other words, the flow passages 51 and 52 are provided to sandwich the porous body 60 from both sides.

At least a part of bottomed holes forming the porous body 60 communicates to the flow passages 51 and 52. Accordingly, the working fluid C can permeate into the porous body 60. In addition, because the porous body 60 is provided approximately at a center part of the liquid pipe 40, the porous body 60 also functions as a column. As a result, it is possible to prevent the liquid pipe 40 from collapsing due to pressure during the solid-phase bonding, for example.

The flow passage 51 is formed by a bottomed groove 51x and a bottomed groove 51y that communicate with each other. In addition, the flow passage 52 is formed by a bottomed groove 52x and a bottomed groove 52y that communicate with each other. More particularly, the metal layer 62 includes the bottomed grooves 51x and 52x that open on the side of the metal layer 63. Further, the metal layer 63 includes the bottomed grooves 51y and 52y that open on the side of the metal layer 62. The bottomed grooves 51x and 52x, and the bottomed grooves 51y and 52y may have a semi-cylindrical concave shape formed by inner wall surfaces that are curved surfaces, for example.

Cross sectional shapes of the bottomed grooves 51x and 52x, and the bottomed grooves 51y and 52y, parallel to an XZ-plane, may be an approximately semi-circular shape or an approximately semi-oval shape, for example. The approximately semi-circular shape not only includes a semi-circular shape obtained by bisecting a true circle, but also shapes having an arc that is longer or shorter than the semi-circular shape. In addition, the approximately semi-oval shape not only includes a semi-oval shape obtained by bisecting an oval, but also shapes having an arc that is longer or shorter than the semi-oval shape.

The bottomed groove 51x and the bottomed groove 51y have maximum openings of approximately the same width, and are arranged at overlapping positions in the plan view so that the openings face the inner side. For this reason, the opening of the bottomed groove 51x and the opening of the bottomed groove 51y communicate with each other to form the flow passage 51. Similarly, the bottomed groove 52x and the bottomed groove 52y have maximum openings of approximately the same width, and are arranged at overlapping positions in the plan view so that the openings face the inner side. For this reason, the opening of the bottomed groove 52x and the opening of the bottomed groove 52y communicate with each other to form the flow passage 52.

In other words, the bottomed groove 51x and the bottomed groove 51y are arranged to oppose each other and communicate in the thickness direction (Z-direction), to form the flow passage 51. In addition, the bottomed groove 52x and the bottomed groove 52y are arranged to oppose each other and communicate in the thickness direction, to form the flow passage 52. Cross sectional shapes of the flow passages 51 and 52, parallel to the XZ-plane, may be an approximately semi-circular shape or an approximately semi-oval shape, for example.

In the porous body 60, no hole nor groove is formed in the first metal layer (one outermost layer) 61 and the second metal layer (the other outermost layer) 64 (that is, the metal layers forming the outermost layers are continuous layers having no hole nor groove). On the other hand, the (third) metal layer 62 includes a plurality of bottomed holes 62x that cave in from an upper surface side to an approximate center part along the thickness direction, and a plurality of bottomed holes 62y that cave in from a lower surface side to the approximate center part along the thickness direction.

The bottomed holes 62x and the bottomed holes 62y are alternately arranged in the X-direction in the plan view. In addition, the bottomed holes 62x and the bottomed holes 62y are alternately arranged in the Y-direction in the plan view. The bottomed holes 62x and the bottomed holes 62y that are alternately arranged in the X-direction partially overlap in the plan view, and partially overlapping parts of the bottomed hole 62x and the bottomed hole 62y communicate with each other to form a pore 62z. Further, the bottomed holes 62x and the bottomed holes 62y that are alternately arranged in the Y-direction partially overlap in the plan view, and overlapping parts of the bottomed hole 62x and the bottomed hole 62y communicate with each other to form a pore 62z.

Planar shapes of the bottomed holes 62x and 62y may be a circular shape having a diameter of approximately 100 µm to approximately 300 µm, for example. The planar shapes of the bottomed holes 62x and 62y may be an arbitrary shape including an oval shape, a polygonal shape, or the like. Depths of the bottomed holes 62x and 62y may be approximately one-half the thickness of the metal layer 62, for example. An interval (or spacing) $L_1$ between the adjacent bottomed holes 62x that are adjacent along the X-direction may be approximately 100 µm to approximately 400 µm, for example. An interval between the adjacent bottomed holes 62x that are adjacent along the Y-direction may be similar to the interval $L_1$. An interval $L_2$ between the adjacent bottomed holes 62y that are adjacent along the X-direction may be approximately 100 µm to approximately 400 µm, for example. An interval between the adjacent bottomed holes 62y that are adjacent along the Y-direction may be similar to the interval $L_2$.

The cross sectional shapes of the bottomed holes 62x and 62y parallel to the XZ-plane, and the cross sectional shapes of the bottomed holes 62x and 62y parallel to the YZ-plane, may be an approximately semicircular shape or an approximately semi-oval shape, for example. The cross sectional shapes of the bottomed holes 62x and 62y parallel to the XZ-plane, and the cross sectional shapes of the bottomed holes 62x and 62y parallel to the YZ-plane, may be a tapered shape that widens from a bottom surface side towards an opening side, or a vertical shape with respect to the bottom surface.

A width $W_3$ of the pore 62z along a lateral direction may be approximately 10 µm to approximately 50 µm, for example. In addition, a width $W_4$ of the pore 62z along a longitudinal direction may be approximately 50 µm to approximately 150 µm, for example.

The (fourth) metal layer 63 includes a plurality of bottomed holes 63x that cave in from an upper surface side to an approximate center part along the thickness direction, and a plurality of bottomed holes 63y that cave in from a lower surface side to the approximate center part along the thickness direction.

The bottomed holes 63x and the bottomed holes 63y are alternately arranged in the X-direction in the plan view. In addition, the bottomed holes 63x and the bottomed holes 63y are alternately arranged in the Y-direction in the plan view. The bottomed holes 63x and the bottomed holes 63y that are alternately arranged in the X-direction partially overlap in the plan view, and partially overlapping parts of the bottomed hole 63x and the bottomed hole 63y communicate with each other to form a pore 63z. Further, the bottomed holes 63x and the bottomed holes 63y that are alternately arranged in the Y-direction partially overlap in the plan view, and partially overlapping parts of the bottomed hole 63x and the bottomed hole 63y communicate with each other to form a pore 63z. The shapes or the like of the bottomed holes 63x and 63y, and the pore 63z may be similar to the shapes or the like of the bottomed holes 62x and 62y, and the pore 62z.

Further, the bottomed holes 62y of the metal layer 62 and the bottomed holes 63x of the metal layer 63 partially overlap in the plan view, and partially overlapping parts of the bottomed hole 62y and the bottomed hole 63x communicate with each other to form a pore 67z.

The pores formed in each metal layer communicate with each other, and the mutually communicating pores spread three-dimensionally within the porous body 60. For this reason, the working fluid C spreads three-dimensionally within the mutually communicating pores due to capillary force.

However, although FIG. 3B illustrates an example in which the bottomed holes 62x and the bottomed holes 63x overlap in the plan view, and the bottomed holes 62y and the bottomed holes 63y overlap in the plan view, the arrangement of the bottomed holes 62x, 63x, 62y, and 63y is not limited to such an arrangement. In other words, the bottomed holes 62x and the bottomed holes 63x do not necessarily have to overlap in the plan view, and the bottomed holes 62*y* and the bottomed holes 63*y* do not necessarily have to overlap in the plan view, as long as the mutually communicating pores spread three-dimensionally within the porous body 60.

Accordingly, the porous body 60 is provided in the liquid pipe 40, and the porous body 60 extends to a vicinity of the evaporator 10 along the liquid pipe 40. For this reason, the working fluid C in the liquid phase within the liquid pipe 40 is guided to the evaporator 10 due to the capillary force generated in the porous body 60.

As a result, even if the vapor Cv were to backflow within the liquid pipe 40 due to a heat leak or the like from the evaporator 10, the vapor Cv would be pushed back by the capillary force from the porous body 60 acting on the working fluid C in the liquid phase, and thus, it is possible to prevent the backflow of the vapor Cv.

In addition, the porous body 60 is also provided within the evaporator 10. The working fluid C in the liquid phase permeates into a part of the porous body 60 within the evaporator 10, close to the liquid pipe 40. The capillary force from the porous body 60 acting on the working fluid C when the working fluid C permeates into the part of the porous body 60, becomes a pumping force that circulates the working fluid C within the loop heat pipe 1.

Moreover, because this capillary force counteracts with the vapor Cv within the evaporator 10, it is possible to reduce the backflow of the vapor Cv into the liquid pipe 40.

An inlet (not illustrated) is provided in the liquid pipe 40, and the working fluid C is filled into the liquid pipe 40 through the inlet. After filling the working fluid C into the liquid pipe 40, the inlet is sealed by a sealing member (not illustrated), to maintain a hermetically sealed state of the loop heat pipe 1.

[Method of Manufacturing Loop Heat Pipe in First Embodiment]

Next, a method of manufacturing the loop heat pipe in the first embodiment will be described, by mainly referring to manufacturing stages of the flow passage and the porous body. FIG. 4A through FIG. 4D, and FIG. 5A and FIG. 5B are diagrams illustrating examples of the manufacturing stages of the loop heat pipe in the first embodiment.

Figure 4A:
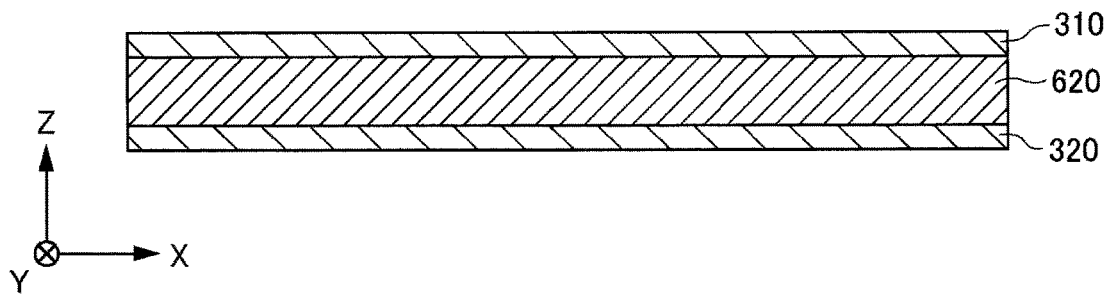
FIG. 4A, FIG. 4B, FIG. 4C, and FIG. 4D are diagrams illustrating examples of manufacturing stages of the loop heat pipe in the first embodiment.

First, in the manufacturing stage illustrated in FIG. 4A, a metal sheet 620 that is formed to the planar shape illustrated in FIG. 1 is prepared. Then, a resist layer 310 is formed on an upper surface of the metal sheet 620, and a resist layer 320 is formed on a lower surface of the metal sheet 620. The metal sheet 620 is a member that finally becomes the metal layer 62. The metal sheet 620 may be made of copper, stainless steel, aluminum, magnesium alloy, or the like, for example. The thickness of the metal sheet 620 may be approximately 50 μm to approximately 200 μm, for example. For example, a photosensitive dry film resist or the like may be used for the resist layers 310 and 320.

Figure 4B:
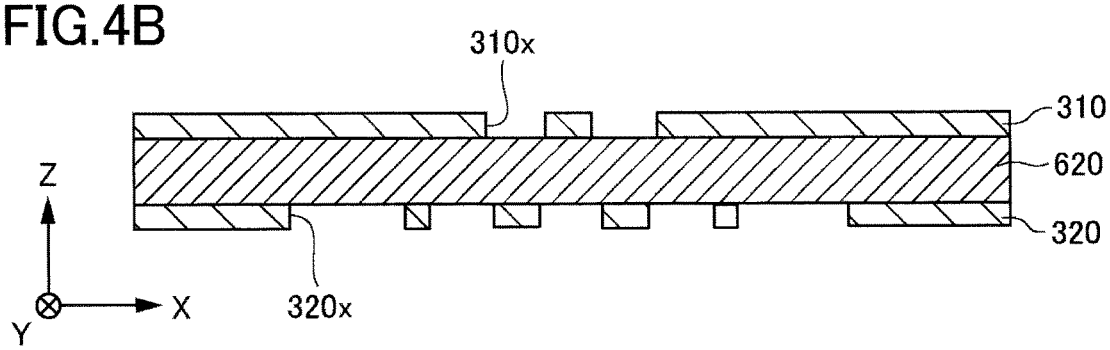

Next, in the manufacturing stage illustrated in FIG. 4B, the resist layer 310 is exposed and developed in regions on the metal sheet 620 where the flow passage 51, the flow passage 52, and the porous body 60 are to be formed, to form openings 310*x* that selectively expose the upper surface of the metal sheet 620. In addition, the resist layer 320 is exposed and developed in regions on the metal sheet 620, to faun openings 320*x* that selectively expose the lower surface of the metal sheet 620. The openings 310*x* are formed so that the shape and arrangement thereof correspond to the shape and arrangement of the bottomed holes 62*x* illustrated in FIG. 3A and FIG. 3B. In addition, the openings 320*x* are formed so that the shape and arrangement thereof correspond to the shape and arrangement of the bottomed grooves 51*x* and 52*x*, and the bottomed holes 62*y* illustrated in FIG. 3A and FIG. 3B.

Figure 4C:
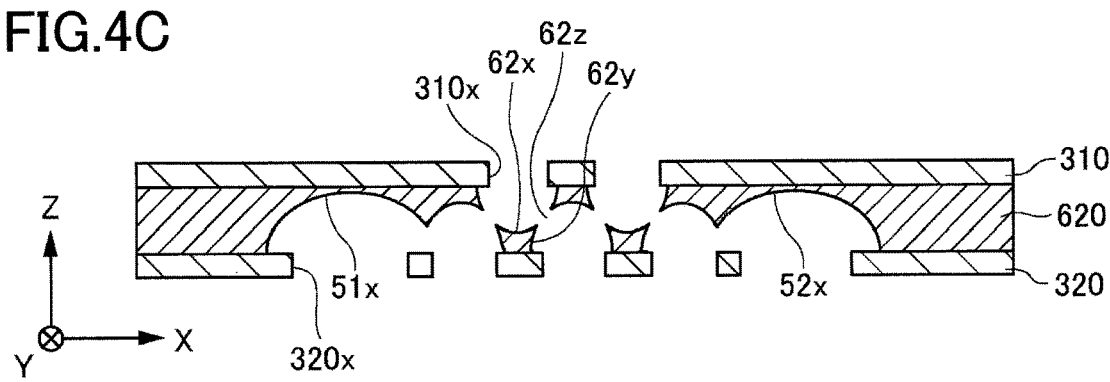

Next, in the manufacturing stage illustrated in FIG. 4C, the metal sheet 620 exposed within the openings 310*x* is half-etched from the upper surface side of the metal sheet 620, and the metal sheet 620 exposed within the openings 320*x* is half-etched from the lower surface side of the metal sheet 620. As a result, the bottomed holes 62*x* are formed in the upper surface side of the metal sheet 620, and the bottomed grooves 51*x* and 52*x*, and the bottomed holes 62*y* are formed in the lower surface side of the metal sheet 620. In addition, because the openings 310*x* and the openings 320*x*, that are alternately arranged along the X-direction on the respective surface sides of the metal sheet 620, partially overlap in the plan view, the partially overlapping parts communicate with each other to form the pores 62*z*. The half-etching of the metal sheet 620 may use a ferric chloride solution, for example.

Figure 4D:
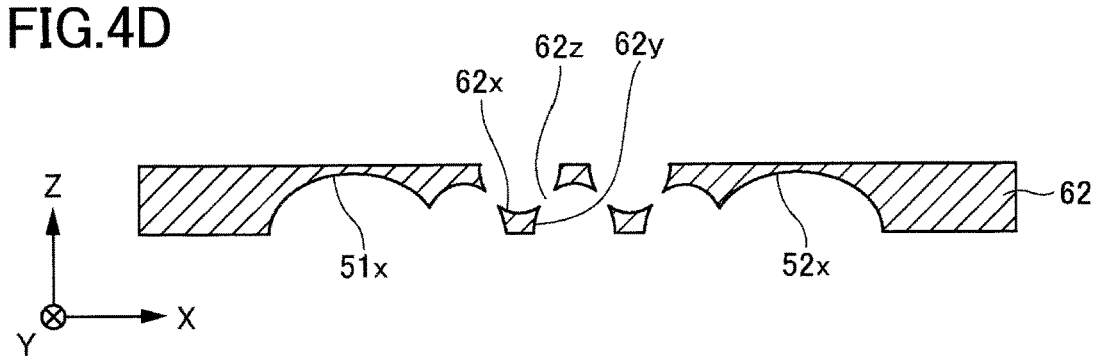

Next, in the manufacturing stage illustrated in FIG. 4D, the resist layers 310 and 320 are stripped using a stripping agent. Hence, the metal layer 62 is completed.

Figure 5A:
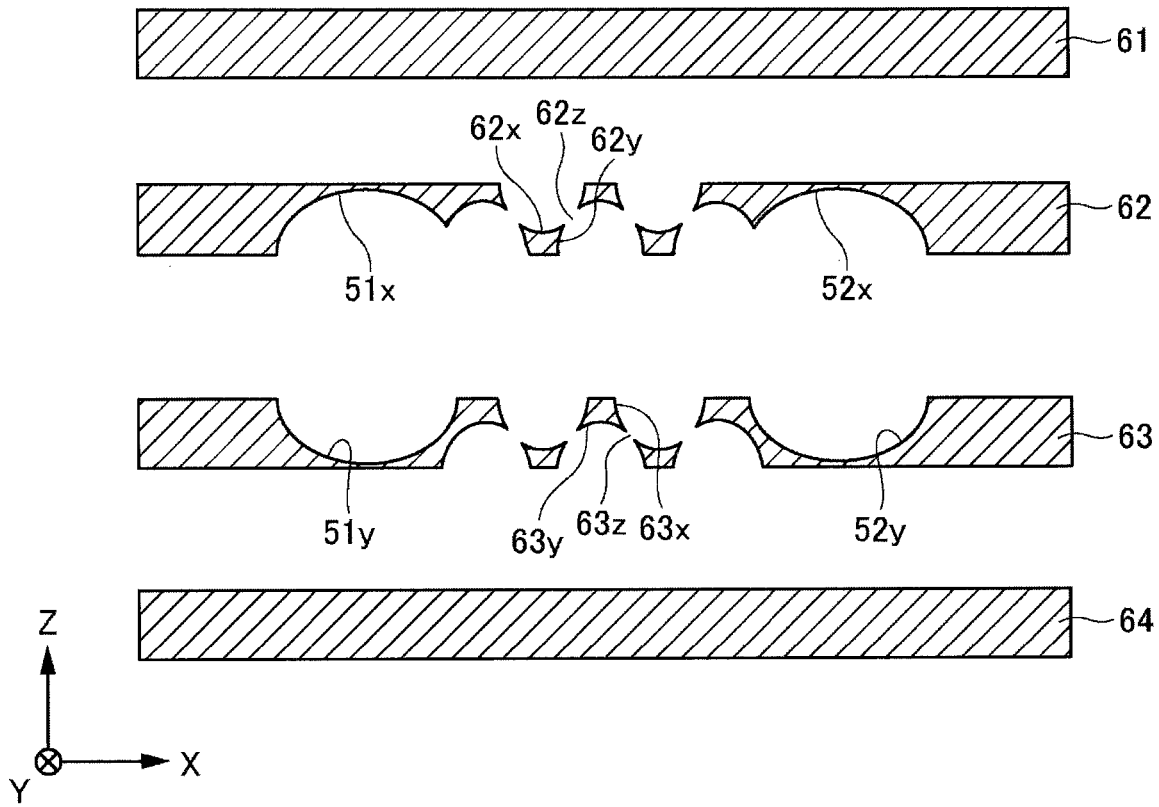
FIG. 5A and FIG. 5B are diagrams illustrating examples of manufacturing stages of the loop heat pipe in the first embodiment.

Next, in the manufacturing stage illustrated in FIG. 5A, the metal layers 61 and 64, that are continuous layers having no holes nor grooves, are prepared. In addition, the metal layer 63 is formed by a method similar to the above described method of forming the metal layer 62. Positions of the bottomed grooves, the bottomed holes, and the pores in the metal layer 63 are as illustrated in FIG. 3A and FIG. 3B, for example.

Figure 5B:
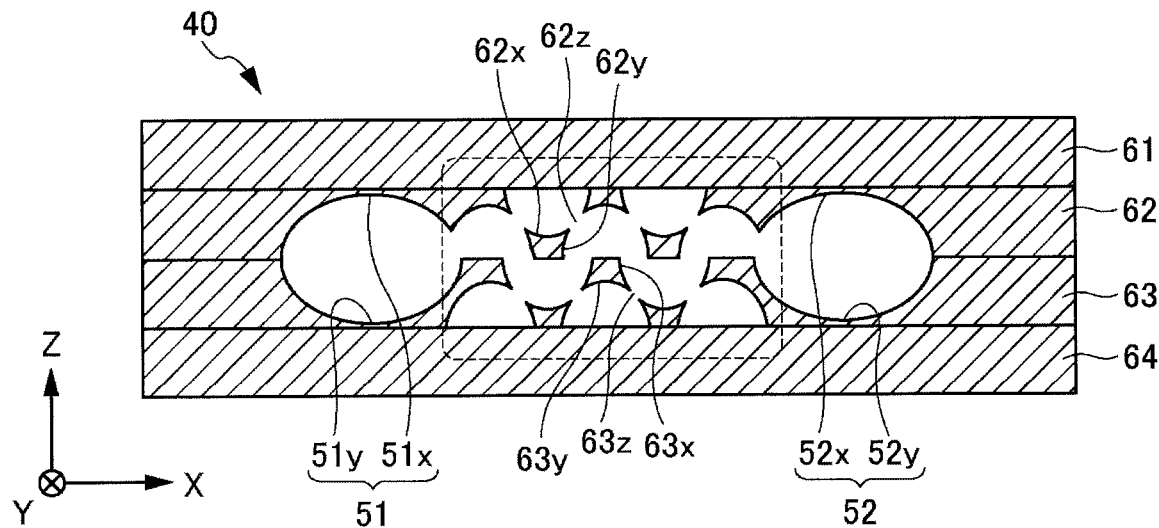

Next, in the manufacturing stage illustrated in FIG. 5B, the metal layers 61 through 64 are stacked in the order illustrated in FIG. 5A, and are bonded by solid-phase bonding including pressing and heating. As a result, the adjacent metal layers are directly bonded to each other, to complete the loop heat pipe 1 having the evaporator 10, the condenser 20, the vapor pipe 30, and the liquid pipe 40, in which the flow passages 51 and 52, and the porous body 60 are formed inside the liquid pipe 40. Then, after a vacuum pump (not illustrated) or the like is used to exhaust or purge the inside of the liquid pipe 40, the working fluid C is filled into the liquid pipe 40 from the inlet (not illustrated), and the inlet is thereafter sealed.

The solid-phase bonding refers to a method of bonding two bonding targets together in the solid-phase (or solid-state) without melting the two bonding targets, by heating, softening, and pressing the bonding targets to cause plastic deformation. Preferably, the metal layers 61 through 64 are all made of the same material, so that the mutually adjacent metal layers can be satisfactorily bonded by the solid-phase bonding.

Accordingly, by employing the structure in which the pores are formed in each metal layer by partially communicating the bottomed holes formed from both the upper and lower surfaces of each metal layer, this embodiment can eliminate the problems encountered by the conventional method of forming the pores, that stacks a plurality of metal layers formed with through-holes so that the through-holes of the plurality of metal layers partially overlap each other. In other words, according to this embodiment, a positional error is not generated when the plurality of metal layers are stacked, and a positional error is not generated due to expansion and contraction of the plurality of metal layers caused by a heat treatment when the plurality of metal layers are stacked. Thus, according to this embodiment, it is possible to form, in the plurality of metal layers, pores having a constant size.

Consequently, it is possible in this embodiment to prevent the capillary force generated by the pores from deteriorating, that is, decreasing, which would otherwise occur if the size of the pores were inconsistent. For this reason, this embodiment can stably obtain the effect of reducing the backflow of the vapor Cv from the evaporator 10 to the liquid pipe 40.

In addition, at the part where the metal layers are stacked, this embodiment employs a structure in which the adjacent bottomed holes overlap in their entirety. For this reason, a bonding area of the stacked metal layers can be made large, to achieve a strong bonding of the stacked metal layers.

Moreover, because each of the metal layer 61 and 64 forming the outermost layers is a continuous layer and no holes nor grooves are formed in this continuous layer, the rigidity of the liquid pipe 40 can be secured (deformation of the liquid pipe 40 can be reduced) by the metal layers 61 and 64 forming the outermost layers.

Next, effects of forming the flow passages 51 and 52 in the liquid pipe 40 will be described, in comparison with a comparison example.

Figure 6A:
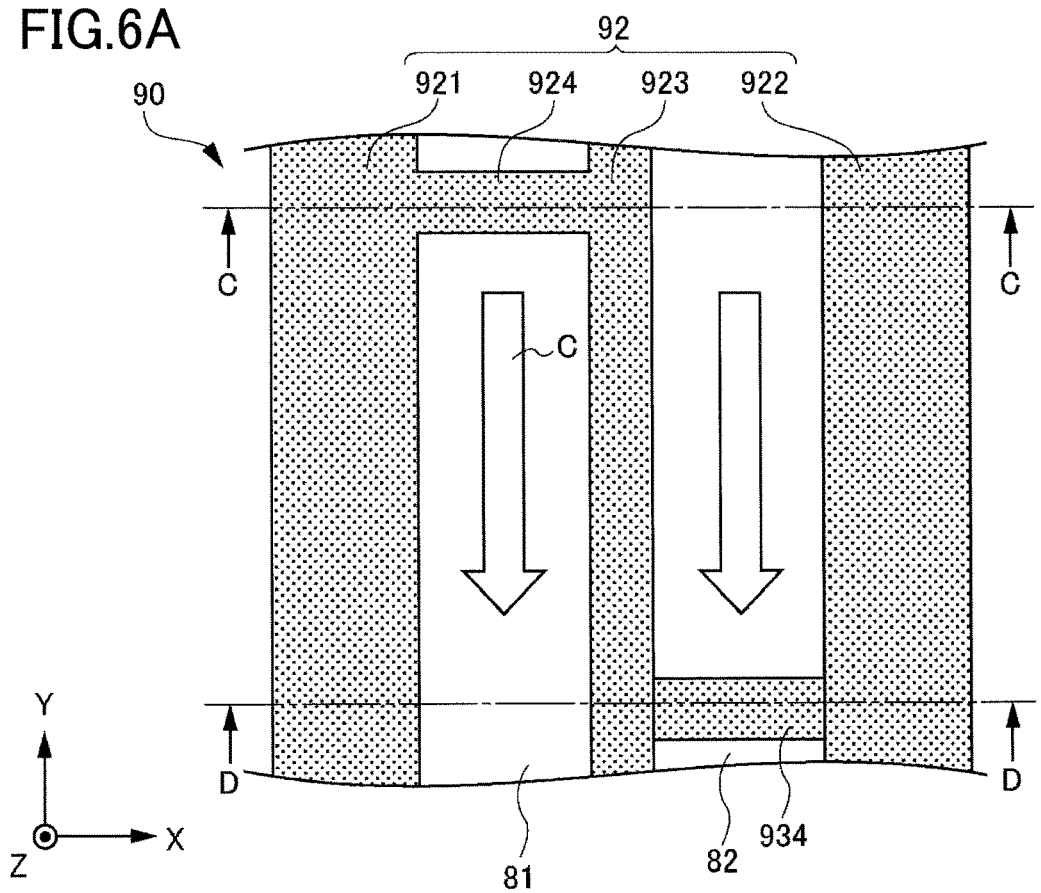
FIG. 6A, FIG. 6B, and FIG. 6C are diagrams illustrating an example of a structure of a liquid pipe of a loop heat pipe in a comparison example.
Figure 6B:
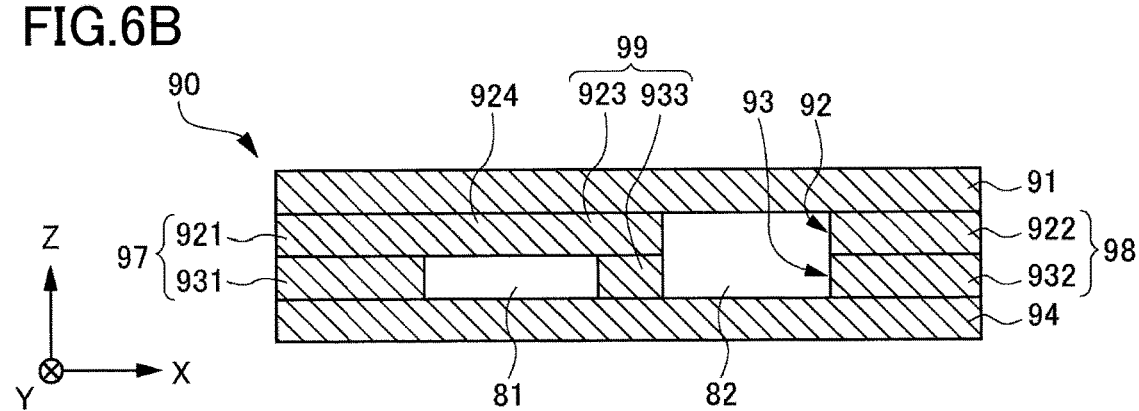
Figure 6C:
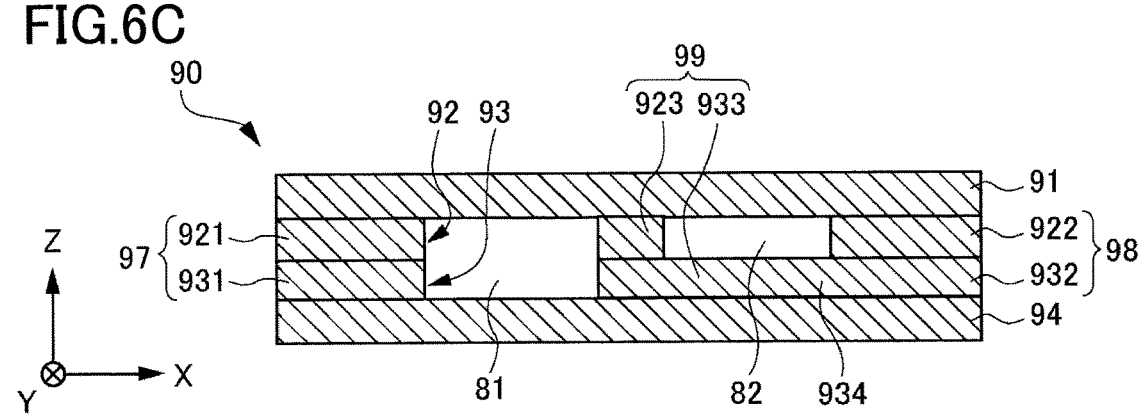

FIG. 6A, FIG. 6B, and FIG. 6C are diagrams illustrating an example of a structure of a liquid pipe of a loop heat pipe in the comparison example. FIG. 6A is a partial plan view of the liquid pipe of the comparison example. In addition, FIG. 6B is a cross sectional view along a line C-C in FIG. 6A, and FIG. 6C is a cross sectional view along a line D-D in FIG. 6A. In FIG. 6A, the illustration of a metal layer 91 is omitted. Further, in FIG. 6A, a flow of the working fluid C is schematically indicated by arrows.

As illustrated in FIG. 6B and FIG. 6C, a liquid pipe 90 includes has a structure in which four metal layers 91 through 94 are successively stacked, for example.

The metal layers 91 and 94 are positioned on two outer sides along a thickness direction of the stacked structure of the metal layers forming the liquid pipe 90. The metal layers 92 and 93 are stacked between the metal layer 91 and the metal layer 94. The metal layers 91 and 94 are continuous layers having no holes nor grooves, and respectively form a part of an outer wall of the liquid pipe 90.

The metal layer 92 includes wall parts 921 and 922 that are arranged to oppose each other with a separation along the X-direction, a column structure 923, and a hanger 924. The metal layer 93 includes wall parts 931 and 932 that are arranged to oppose each other with a separation along the X-direction, a column structure 933, and a hanger 934. The hanger is a member that positions and holds the support structure with respect to the wall part. A required number of hangers is provided at a required number of positions in each metal layer other than the outermost layers.

A stacked part of the wall parts 921 and 931 forms one pipe wall (sidewall) 97 of the liquid pipe 90. In addition, a stacked part of the wall parts 922 and 932 forms another pipe wall (sidewall) 98 of the liquid pipe 90. Further, a stacked part of the column structures 923 and 933 forms a column 99. The column 99 forms a bulkhead 98 between the pipe wall 97 and the pipe wall 98 of the liquid pipe 90.

A flow passage 81 is defined by the pipe wall 97 and the column 99 that oppose each other along the X-direction, and the metal layers 91 and 94 that oppose each other along the Z-direction. In addition, a flow passage 82 is defined by the pipe wall 98 and the column 99 that oppose each other along the X-direction, and the metal layers 91 and 94 that oppose each other along the Z-direction.

Accordingly, the liquid pipe 90 in the comparison example requires the hanger that positions and holds the support structure with respect to the wall part, to be provided in the metal layer other than the outermost layers.

The provision of the hanger not only inhibits the degree of freedom of design of each metal layer, but also reduces space that becomes the flow passage. When the flow passage becomes narrow, a pressure loss, that is an energy loss when the working fluid C flows within the flow passage, becomes large. This pressure loss inhibits the flow of the working fluid C, to greatly deteriorate a heat transfer performance of the loop heat pipe.

On the other hand, in this embodiment, the flow passage is formed by communicating, in the thickness direction, the bottomed grooves that are formed in the adjacent metal layers by the half-etching, and there is no need to provide the hanger. As a result, the flow passage can be made wider by an amount corresponding to the hanger that is not needed, and the pressure loss within the flow passage can be reduced. For this reason, the flow of the working fluid C is not inhibited by the pressure loss, and it is possible to reduce the deterioration in the heat transfer performance of the loop heat pipe 1.

Second Embodiment

In a second embodiment, an example of the liquid pipe includes a flow passage having a cross sectional shape different from that of the first embodiment. A description of constituent elements of the second embodiment, that are the same as the constituent elements of the first embodiment described above, may be omitted.

Figure 7A:
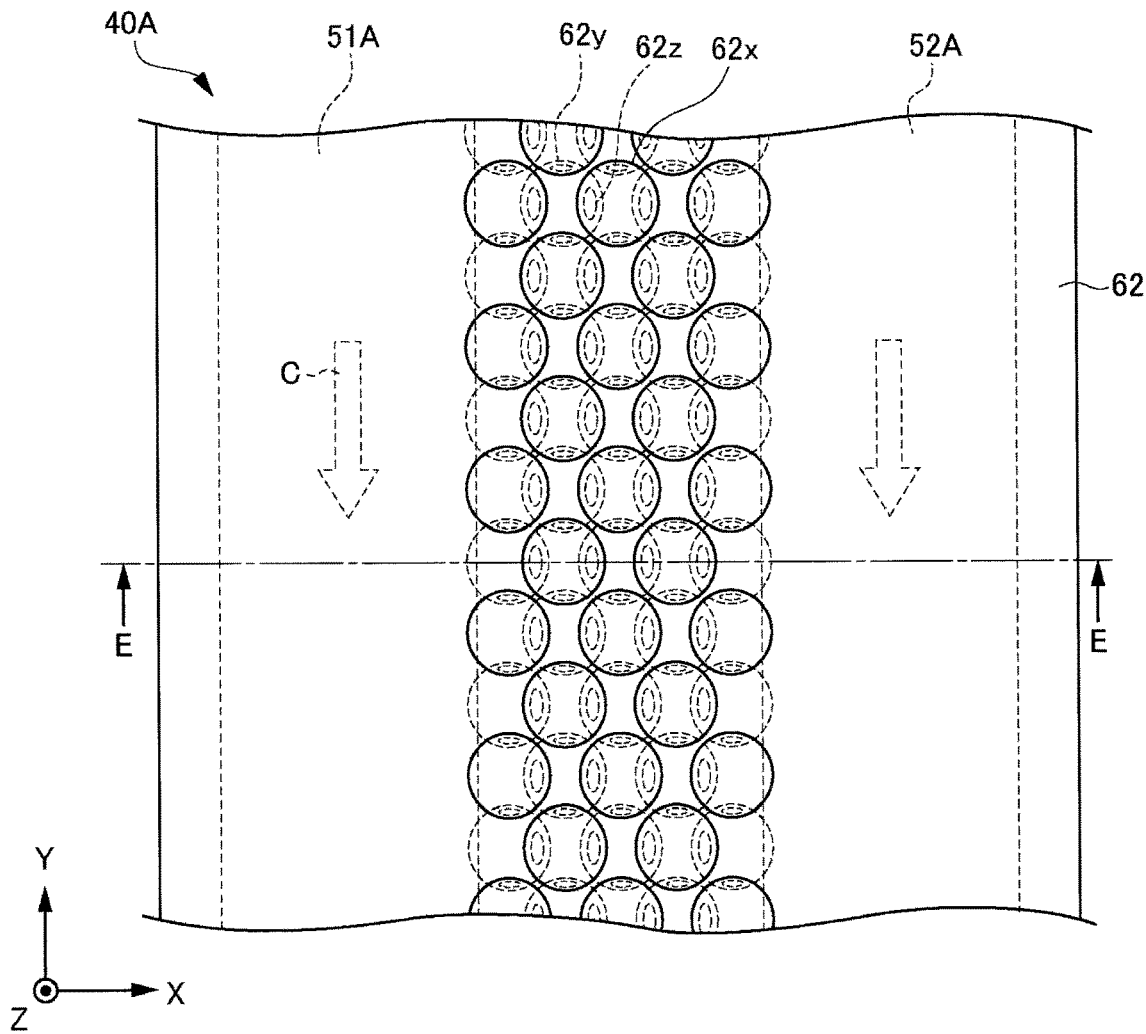
FIG. 7A and FIG. 7B are diagrams illustrating an example of the liquid pipe of the loop heat pipe in a second embodiment.
Figure 7B:
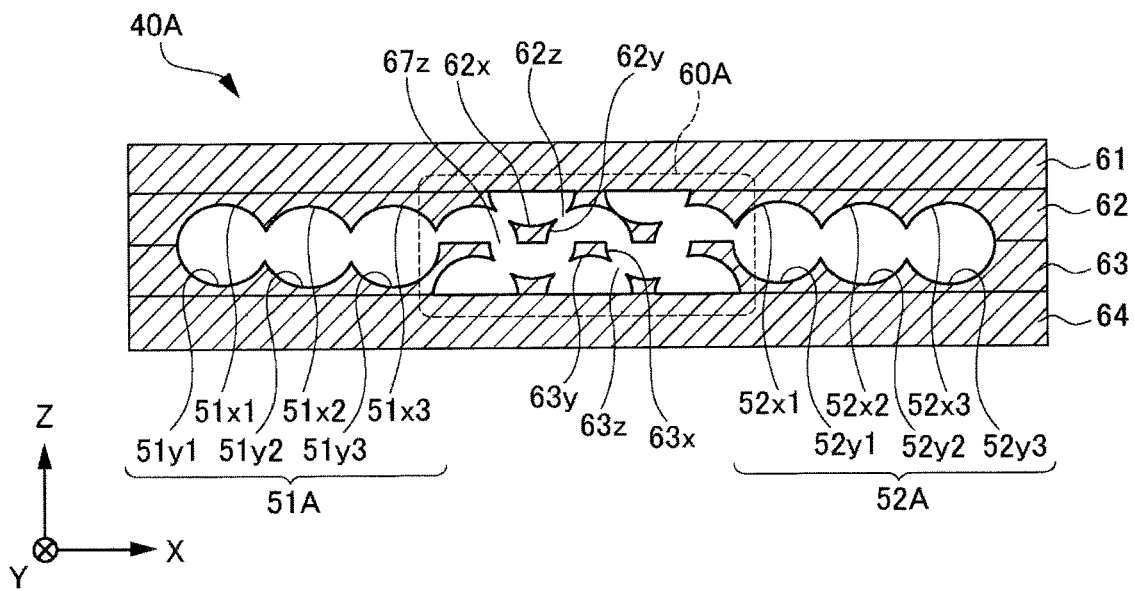

FIG. 7A and FIG. 7B are diagrams illustrating the example of the liquid pipe of the loop heat pipe in the second embodiment. FIG. 7A is a partial enlarged plan view corresponding to FIG. 3A, and FIG. 7B is a cross sectional view along a line E-E in FIG. 7A. FIG. 7A illustrates a planar shape of a porous body 60A within a liquid pipe 40A, and for this reason, the illustration of the metal layer (metal layer 61 illustrated in FIG. 7B) that becomes one of two outermost layers is omitted in FIG. 7A.

As illustrated in FIG. 7B, a flow passages 51A and 52A, and the porous body 60A are provided in the liquid pipe 40A. The flow passage 51A is provided on the side of one end of the porous body 60A along the X-direction, and the flow passage 52A is provided on the side of the other end of the porous body 60A along the X-direction. In other words, the flow passages 51A and 52A are provided to sandwich the porous body 60A from both sides. The porous body 60A is designated by a reference numeral different from that used in the first embodiment, however, a description of the porous body 60A will be omitted because the porous body 60A may basically have the same structure as the porous body 60 of the first embodiment.

At least a part of bottomed holes forming the porous body 60A communicates to the flow passages 51A and 52A. Accordingly, the working fluid C can permeate into the porous body 60A. In addition, because the porous body 60A is provided approximately at a center part of the liquid pipe 40A, the porous body 60A also functions as a column. As a result, it is possible to prevent the liquid pipe 40A from collapsing due to pressure during the solid-phase bonding, for example.

The flow passage 51A is formed by bottomed grooves 51$x$1, 51$x$2, and 51$x$3, and bottomed grooves 51$y$1, 51$y$2, and 51$y$3 that communicate with each other. In addition, the flow passage 52A is formed by bottomed grooves 52$x$1, 52$x$2, and 52$x$3, and bottomed grooves 52$y$1, 52$y$2, and 52$y$3 that communicate with each other.

More particularly, in the metal layer 62, the bottomed grooves 51$x$1, 51$x$2, and 51$x$3 are arranged in the X-direction, with longitudinal directions thereof extending in the Y-direction, and communicate in a plane direction (X-direction) by opening on the side of the metal layer 63. In addition, in the metal layer 62, the bottomed grooves 52$x$1, 52$x$2, and 52$x$3 are arranged in the X-direction, with longitudinal directions thereof extending in the Y-direction, and communicate in the plane direction (X-direction) by opening on the side of the metal layer 63.

In the metal layer 63, the bottomed grooves 51$y$1, 51$y$2, and 51$y$3 are arranged in the X-direction, with longitudinal directions thereof extending in the Y-direction, and communicate in the plane direction (X-direction) by opening on the side of the metal layer 62. In addition, in the metal layer 63, the bottomed grooves 52$y$1, 52$y$2, and 52$y$3 are arranged in the X-direction, with longitudinal directions thereof extending in the Y-direction, and communicate in the plane direction (X-direction) by opening on the side of the metal layer 62.

The bottomed grooves 51$x$1, 51$x$2, 51$x$3, 52$x$1, 52$x$2, and 52$x$3, and the bottomed grooves 51$y$1, 51$y$2, 51$y$3, 52$y$1, 52$y$2, and 52$y$3 may have a semi-cylindrical concave shape famed by inner wall surfaces that are curved surfaces, for example.

Cross sectional shapes of the bottomed grooves bottomed grooves 51$x$1, 51$x$2, 51$x$3, 52$x$1, 52$x$2, and 52$x$3, and the bottomed grooves 51$y$1, 51$y$2, 51$y$3, 52$y$1, 52$y$2, and 52$y$3, parallel to the XZ-plane, may be an approximately semi-circular shape or an approximately semi-oval shape, for example.

The bottomed grooves 51$x$1, 51$x$2, and 51$x$3, and the bottomed grooves 51$y$1, 51$y$2, and 51$y$3 that communicate with each other in the X-direction, have maximum openings of approximately the same width, and are arranged at overlapping positions in the plan view so that the openings face the inner side. For this reason, the openings of, the bottomed grooves 51$x$1, 51$x$2, and 51$x$3, and the bottomed grooves 51$y$1, 51$y$2, and 51$y$3 that communicate with each other in the X-direction, communicate with one another to form the flow passage 51A.

Similarly, the bottomed grooves 52$x$1, 52$x$2, and 52$x$3, and the bottomed grooves 52$y$1, 52$y$2, and 52$y$3 that communicate with each other in the X-direction, have maximum openings of approximately the same width, and are arranged at overlapping positions in the plan view so that the openings face the inner side. For this reason, the openings of, the bottomed grooves 52$x$1, 52$x$2, and 52$x$3, and the bottomed grooves 52$y$1, 52$y$2, and 52$y$3 that communicate with each other in the X-direction, communicate with one another to form the flow passage 52A.

In other words, the bottomed grooves 51$x$1, 51$x$2, and 51$x$3, and the bottomed grooves 51$y$1, 51$y$2, and 51$y$3 are arranged to oppose each other and communicate in the thickness direction (Z-direction), to form the flow passage 51A. In addition, the bottomed grooves 52$x$1, 52$x$2, and 52$x$3, and the bottomed grooves 52$y$1, 52$y$2, and 52$y$3 are arranged to oppose each other and communicate in the thickness direction, to form the flow passage 52A. Cross sectional shapes of the flow passages 51A and 52A, parallel to the XZ-plane, may be an arrangement of approximately semi-circular shapes or approximately semi-oval shapes, for example, that are arranged in the X-direction while communicating with each other.

Hence, the cross sectional shape of the flow passage parallel to the XZ-plane may be a single approximately circular shape or approximately oval shape, or a shape including a plurality of approximately circular shapes or approximately oval shapes that are arranged in the X-direction while communicating with each other.

However, when forming the flow passage to the single approximately circular shape or approximately oval shape, one approximately circular or approximately oval shaped bottomed groove needs to be formed in each of the adjacent metal layers by the half-etching. However, when forming one approximately circular or approximately oval shaped bottomed groove by the half-etching, the width of the bottomed groove becomes limited with respect to the thickness of the metal layer, because the etching is simultaneously performed in the depth direction and the width direction. Consequently, it is difficult to form a flow passage that is wide in the X-direction.

On the other hand, when forming the flow passage to the plurality of approximately circular shapes or approximately oval shapes that are arranged in the X-direction while communicating with each other, no problem is encountered even if the width of one approximately circular or approximately oval shaped bottomed groove formed by the half-etching becomes limited. This is because, even if the width of one bottomed groove formed by the half-etching becomes limited, a flow passage that is wide in the X-direction can easily be formed by arranging the plurality of bottomed grooves in the X-direction while communicating the plurality of bottomed grooves with each other. In other words, even if the width of one bottomed groove becomes limited, the number of bottomed grooves that communicate with each other may be changed, to easily adjust the width of the flow passage in the X-direction.

In the example illustrated in FIG. 7A and FIG. 7B, the cross sectional shape of the flow passage parallel to the XZ-plane includes three approximately circular shaped or approximately oval shaped bottomed grooves that are arranged in the X-direction while communicating with each other, however, the number of mutually communicating bottomed grooves is not limited to three. For example, the cross sectional shape of the flow passage parallel to the XZ-plane may include two or four or more approximately circular shaped or approximately oval shaped bottomed grooves that are arranged in the X-direction while communicating with each other.

Third Embodiment

In a third embodiment, an example of the liquid pipe includes a flow passage formed at a position different from that of the second embodiment. A description of constituent elements of the third embodiment, that are the same as the constituent elements of the first and second embodiments described above, may be omitted.

Figure 8A:
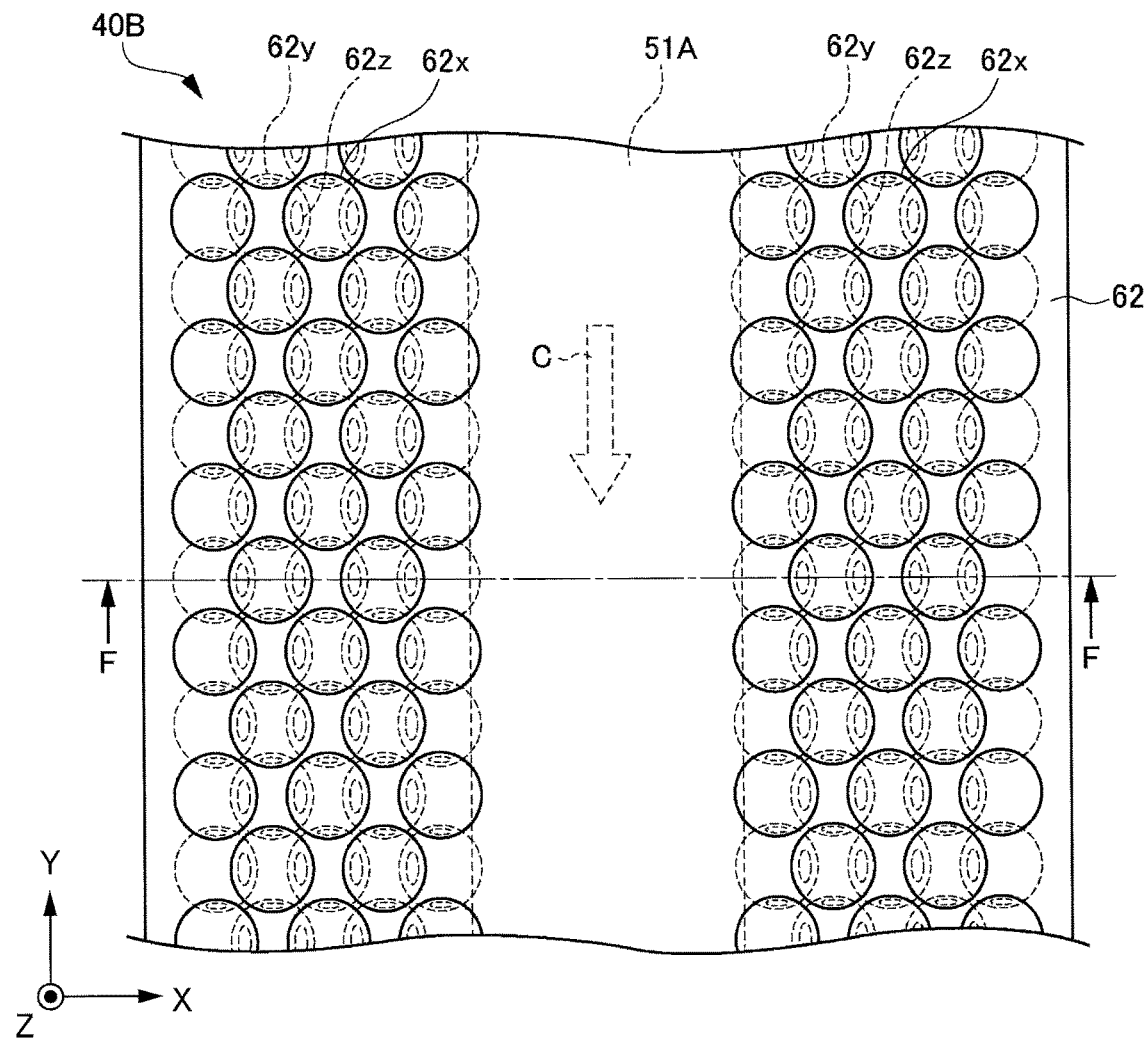
FIG. 8A and FIG. 8B are diagrams illustrating an example of the liquid pipe of the loop heat pipe in a third embodiment.
Figure 8B:
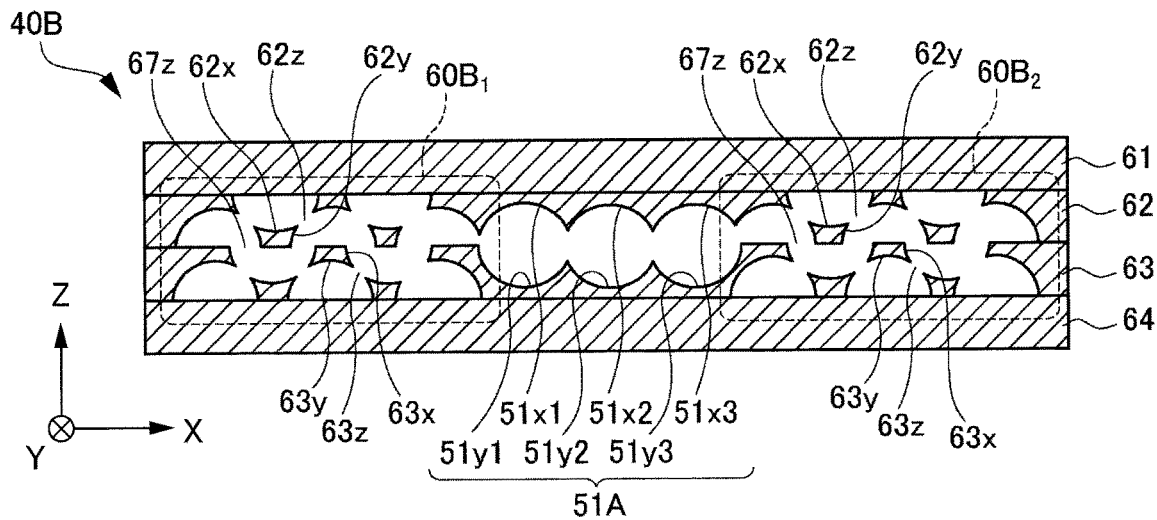

FIG. 8A and FIG. 8B are diagrams illustrating the example of the liquid pipe of the loop heat pipe in the third embodiment. FIG. 8A is a partial enlarged plan view corresponding to FIG. 3A, and FIG. 8B is a cross sectional view along a line F-F in FIG. 8A. FIG. 8A illustrates planar shapes of porous bodies 60B$_1$ and 60B$_2$ within a liquid pipe 40B, and for this reason, the illustration of the metal layer (metal layer 61 illustrated in FIG. 8B) that becomes one of two outermost layers is omitted in FIG. 8A.

As illustrated in FIG. 8B, the flow passage 51A, and the porous bodies 60B$_1$ and 60B$_2$ are provided in the liquid pipe 40B. The porous body 60B$_1$ is provided on the side of one end of the flow passage 51A along the X-direction, and the porous body 60B$_2$ is provided on the side of the other end of the flow passage 51A along the X-direction. In other words, the porous bodies $60B_1$ and $60B_2$ are provided to sandwich the flow passage 51A from both sides.

The flow passage 51A may have the structure described above in conjunction with FIG. 7A and FIG. 7B. In addition, the porous bodies $60B_1$ and $60B_2$ are designated by reference numerals different from that used in the first embodiment, however, a description of the porous bodies $60B_1$ and $60B_2$ will be omitted because the porous bodies $60B_1$ and $60B_2$ may basically have the same structure as the porous body 60 of the first embodiment.

At least a part of bottomed holes forming the porous bodies $60B_1$ and $60B_2$ communicates to the flow passage 51A. Accordingly, the working fluid C can permeate into the porous bodies $60B_1$ and $60B_2$.

Accordingly, the flow passage and the porous bodies may be arranged arbitrarily as long as the flow passage and the porous bodies communicate with each other. Of course, the first embodiment may be modified to the third embodiment.

Fourth Embodiment

In a fourth embodiment, an example of the liquid pipe includes five metal layers that are stacked. A description of constituent elements of the fourth embodiment, that are the same as the constituent elements of the first through third embodiments described above, may be omitted.

Figure 9A:
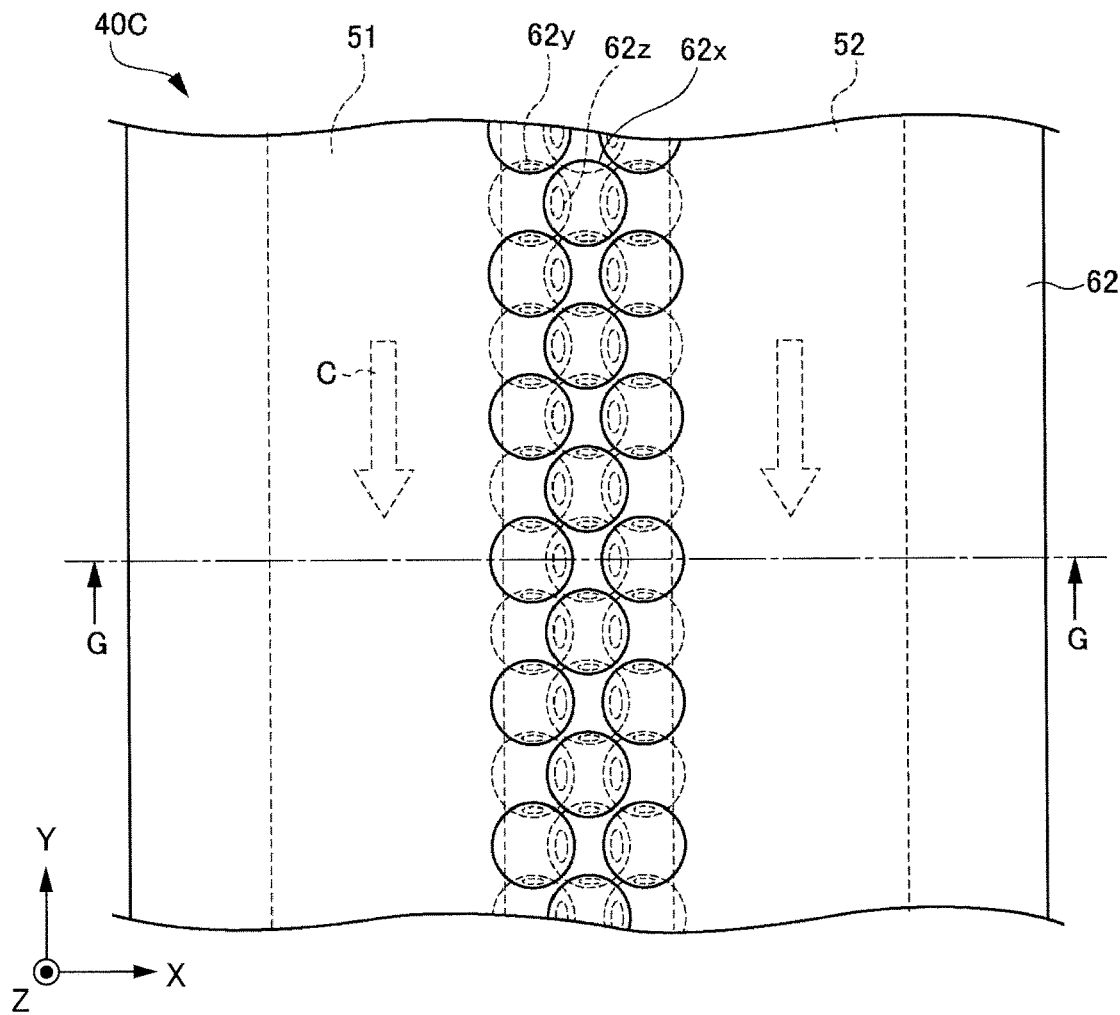
FIG. 9A and FIG. 9B are diagrams illustrating an example of the liquid pipe of the loop heat pipe in a fourth embodiment.
Figure 9B:
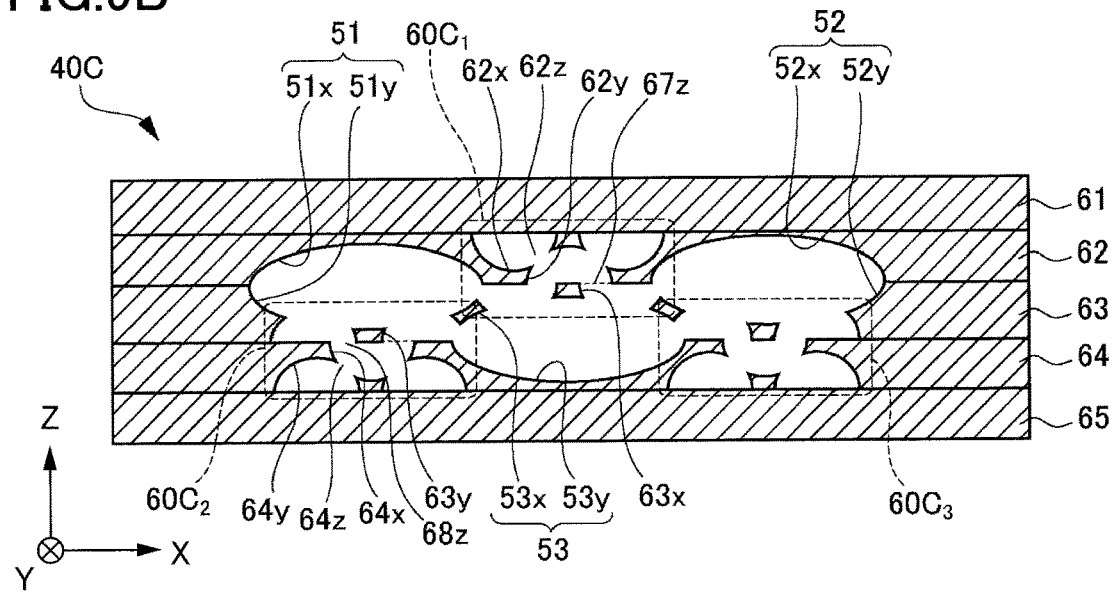

FIG. 9A and FIG. 9B are diagrams illustrating the example of the liquid pipe of the loop heat pipe in the fourth embodiment. FIG. 9A is a partial enlarged plan view corresponding to FIG. 3A, and FIG. 9B is a cross sectional view along a line G-G in FIG. 9A. FIG. 9A illustrates a planar shape of a porous body $60C_1$ within a liquid pipe 40C, and for this reason, the illustration of the metal layer (metal layer 61 illustrated in FIG. 9B) that becomes one of two outermost layers is omitted in FIG. 9A.

As illustrated in FIG. 9B, the liquid pipe 40C has a structure in which five metal layers 61 through 65 are successively stacked, and flow passages 51, 52, and 53, and porous bodies $60C_1$, $60C_2$, and $60C_3$ are provided in the liquid pipe 40C. In this example, the metal layer 65 forms an example of the second metal layer forming the outermost layer, and the metal layer 64 forms an example of a fifth metal layer.

The flow passages 51 and 52, and the porous body $60C_1$ are provided in the metal layers 62 and 63 of the liquid pipe 40C. The flow passage 51 is provided on the side of one end of the porous body $60C_1$ along the X-direction, and the flow passage 52 is provided on the side of the other end of the porous body $60C_1$ along the X-direction. In other words, the flow passages 51 and 52 are provided to sandwich the porous body $60C_1$ from both sides.

The flow passages 51 and 52 may have the structure described above in conjunction with FIG. 3A and FIG. 3B. However, the bottomed grooves 51y and 52y communicate with different bottomed holes 63y, respectively. In addition, the porous body $60C_1$ is designated by a reference numeral different from that used in the first embodiment, however, a description of the porous body $60C_1$ will be omitted because the porous body $60C_1$ may basically have the same structure as the porous body 60 of the first embodiment.

The flow passage 53, and the porous bodies $60C_2$ and $60C_3$ are provided in the metal layers 63 and 64 of the liquid pipe 40C. The porous body $60C_2$ is provided on the side of one end of the flow passage 53 along the X-direction, and the porous body $60C_3$ is provided on the side of the other end of the flow passage 53 along the X-direction. In other words, the porous bodies $60C_2$ and $60C_3$ are provided to sandwich the flow passage 53 from both sides.

The flow passage 53 is formed by a bottomed groove 53x and a bottomed groove 53y that communicate with each other. More particularly, the metal layer 63 includes the bottomed groove 53x that opens on the side of the metal layer 64. The bottomed groove 53x communicates with the bottomed hole 63x. In addition, the metal layer 64 includes the bottomed groove 53y that opens on the side of the metal layer 63. The bottomed groove 53x and the bottomed groove 53y may have a semi-cylindrical concave shape famed by inner wall surfaces that are curved surfaces, for example.

Cross sectional shapes of the bottomed grooves 53x and 53y, parallel to an XZ-plane, may be an approximately semi-circular shape or an approximately semi-oval shape, for example. The bottomed groove 53x and the bottomed groove 53y have maximum openings of approximately the same width, and are arranged at overlapping positions in the plan view so that the openings face the inner side. For this reason, the opening of the bottomed groove 53x and the opening of the bottomed groove 53y communicate with each other to form the flow passage 53.

In other words, the bottomed groove 53x and the bottomed groove 53y are arranged to oppose each other and communicate in the thickness direction (Z-direction), to form the flow passage 53. A cross sectional shape of the flow passage 53, parallel to the XZ-plane, may be an approximately semi-circular shape or an approximately semi-oval shape, for example.

The porous bodies $60C_2$ and $60C_3$ include bottomed holes 63x, 63y, 64x, and 64y. The metal layer 64 includes a plurality of bottomed holes 64x that cave in from an upper surface side to an approximate center part along the thickness direction, and a plurality of bottomed holes 64y that cave in from a lower surface side to the approximate center part along the thickness direction.

The bottomed holes 64x and the bottomed holes 64y are alternately arranged in the X-direction in the plan view. In addition, the bottomed holes 64x and the bottomed holes 64y are alternately arranged in the Y-direction in the plan view. The bottomed holes 64x and the bottomed holes 64y that are alternately arranged in the X-direction partially overlap in the plan view, and partially overlapping parts of the bottomed hole 64x and the bottomed hole 64y communicate with each other to form a pore 64z. Further, the bottomed holes 64x and the bottomed holes 64y that are alternately arranged in the Y-direction partially overlap in the plan view, and overlapping parts of the bottomed hole 64x and the bottomed hole 64y communicate with each other to form a pore 64z. The shapes or the like of the bottomed holes 64x and 64y, and the pore 64z may be similar to the shapes or the like of the bottomed holes 62x and 62y, and the pores 62z, for example.

In addition, the bottomed hole 63y of the metal layer 63 and the bottomed hole 64x of the metal layer 64 partially overlap in the plan view, and overlapping parts of the bottomed hole 63y and the bottomed hole 64x communicate with each other to form a pore 68z.

At least a part of bottomed holes forming the porous body $60C_1$ communicates to the flow passages 51, 52, and 53. In addition, at least a part of bottomed holes forming the porous body $60C_2$ communicates to the flow passages 51 and 53. Further, at least a part of bottomed holes forming the porous body $60C_3$ communicates to the flow passages 52 and 53. Accordingly, the working fluid C can permeate into the porous bodies $60C_1$, $60C_2$, and $60C_3$.

As described above, the liquid pipe does not need to have the structure in which four metal layers are successively stacked. For example, the liquid pipe may have the structure in which five metal layers are successively stacked. When forming the liquid pipe by stacking five metal layers, an arbitrary number of flow passages and porous bodies may be provided at an arbitrary number of positions in the metal layers 62 through 64 forming the inner layers.

Fifth Embodiment

In a fifth embodiment, an example of the liquid pipe includes six metal layers that are stacked. A description of constituent elements of the fifth embodiment, that are the same as the constituent elements of the first through fourth embodiments described above, may be omitted.

Figure 10A:
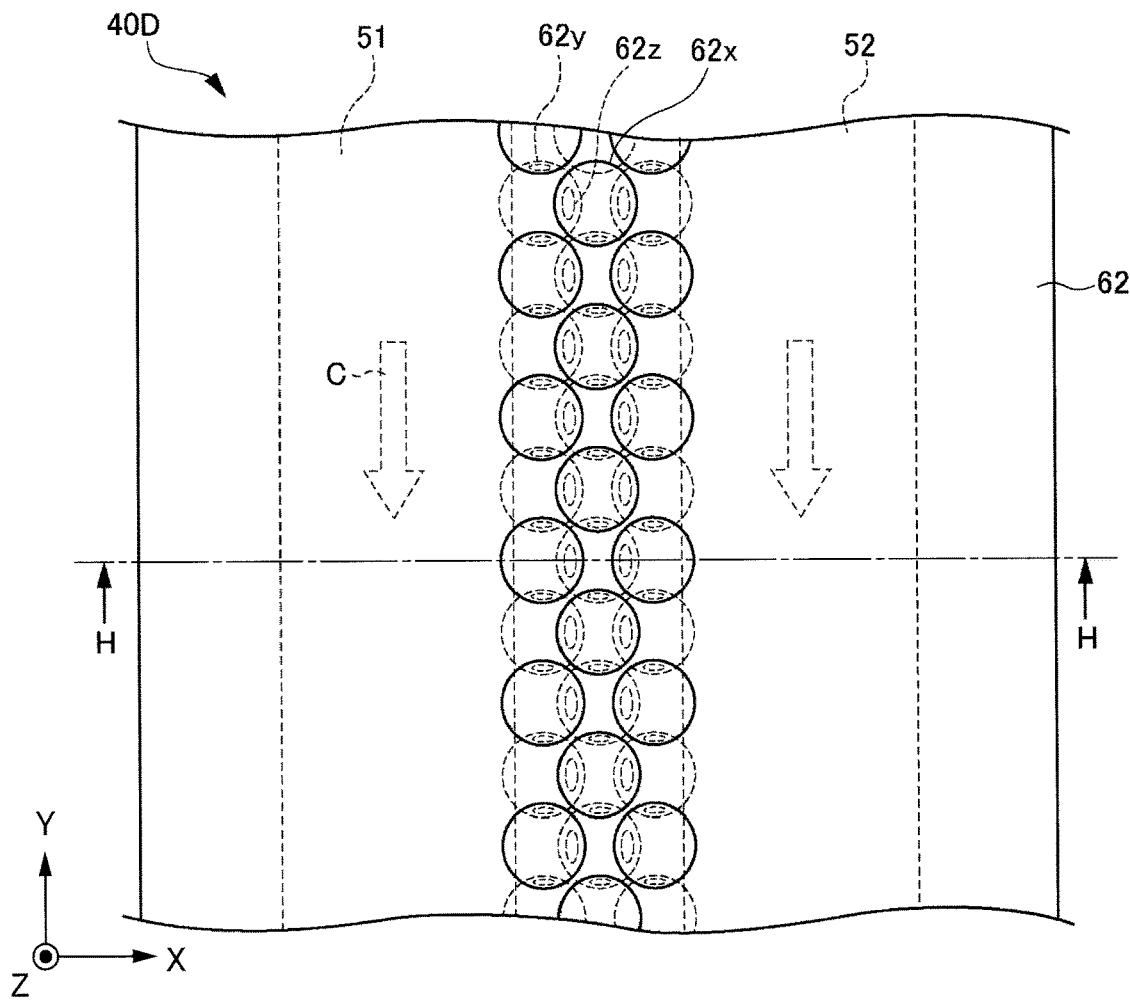
FIG. 10A and FIG. 10B are diagrams illustrating an example of the liquid pipe of the loop heat pipe in a fifth embodiment.
Figure 10B:
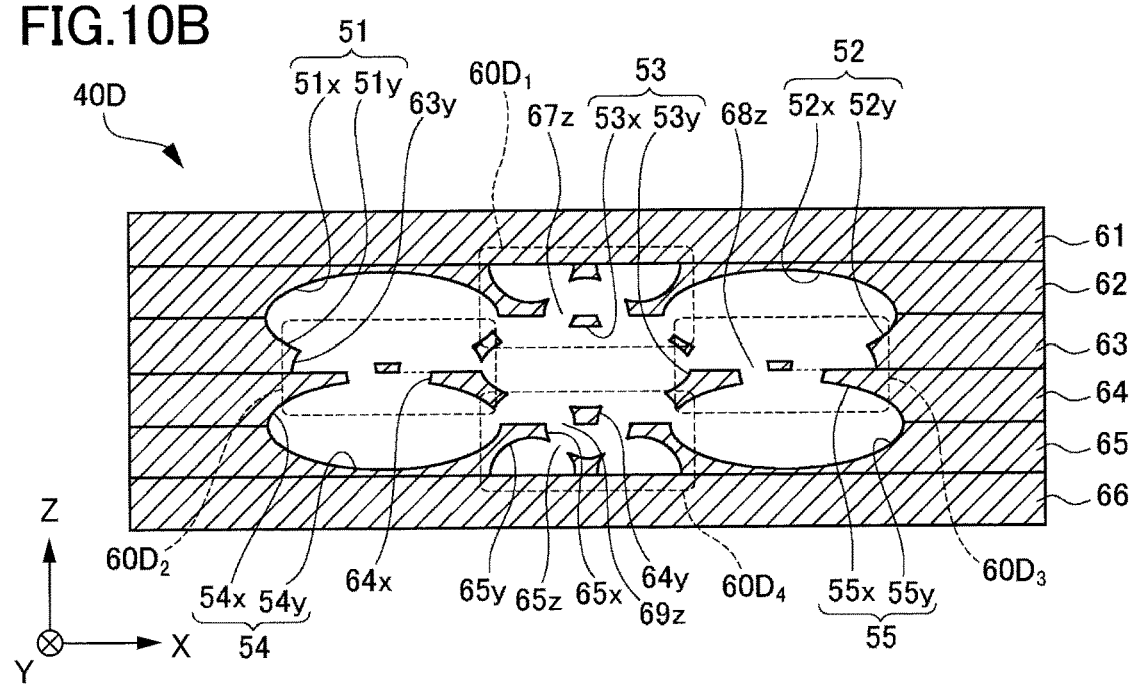

FIG. 10A and FIG. 10B are diagrams illustrating the example of the liquid pipe of the loop heat pipe in the fifth embodiment. FIG. 10A is a partial enlarged plan view corresponding to FIG. 3A, and FIG. 10B is a cross sectional view along a line H-H in FIG. 10A. FIG. 10A illustrates a planar shape of a porous body $60D_1$ within a liquid pipe 40D, and for this reason, the illustration of the metal layer (metal layer 61 illustrated in FIG. 10B) that becomes one of two outermost layers is omitted in FIG. 10A.

As illustrated in FIG. 10B, the liquid pipe 40D has a structure in which six metal layers 61 through 66 are successively stacked, and flow passages 51, 52, 53, 54, and 55, and porous bodies $60D_1$, $60D_2$, $60D_3$, and $60D_4$ are provided in the liquid pipe 40D. In this example, the metal layer 66 forms an example of the second metal layer forming the outermost layer, the metal layer 65 forms an example of a sixth metal layer.

The flow passages 51 and 52, and the porous body $60D_1$ are provided in the metal layers 62 and 63 of the liquid pipe 40D. The flow passage 51 is provided on the side of one end of the porous body $60D_1$ along the X-direction, and the flow passage 52 is provided on the side of the other end of the porous body $60D_1$. In other words, the flow passages 51 and 52 are provided to sandwich the porous body $60D_1$ from both sides.

The flow passages 51 and 52 may have the structure described above in conjunction with FIG. 3A and FIG. 3B. However, the bottomed grooves 51$y$ and 52$y$ communicate with different bottomed holes 63$y$, respectively. In addition, the porous body $60D_1$ is designated by a reference numeral different from that used in the first embodiment, however, a description of the porous body $60D_1$ will be omitted because the porous body $60D_1$ may basically have the same structure as the porous body 60 of the first embodiment.

The flow passage 53, and the porous bodies $60D_2$ and $60D_3$ are provided in the metal layers 63 and 64 of the liquid pipe 40D. The porous body $60D_2$ is provided on the side of one end of the flow passage 53 along the X-direction, and the porous body $60D_3$ is provided on the side of the other end of the flow passage 53 along the X-direction. In other words, the porous bodies $60D_2$ and $60D_3$ are provided to sandwich the flow passage 53 from both sides.

The flow passage 53 may have the structure described above in conjunction with FIG. 9A and FIG. 9B. However, the bottomed grooves 53$y$ communicates with the bottomed hole 64$y$. In addition, the porous bodies $60D_2$ and $60D_3$ are designated by a reference numeral different from that used in the first embodiment, however, a description of the porous bodies $60D_2$ and $60D_3$ will be omitted because the porous bodies $60D_2$ and $60D_3$ may basically have the same structure as the porous bodies $60D_2$ and $60D_3$ of the fourth embodiment.

The flow passages 54 and 55, and the porous body $60D_4$ are provided in the metal layers 64 and 65 of the liquid pipe 40D. The flow passage 54 is provided on the side of one end of the porous body $60D_4$ along the X-direction, and the flow passage 55 is provided on the side of the other end of the porous body $60D_4$. In other words, the flow passages 54 and 55 are provided to sandwich the porous body $60D_4$ from both sides.

The flow passage 54 is formed by a bottomed groove 54$x$ and a bottomed groove 54$y$ that communicate with each other. In addition, the flow passage 55 is formed by a bottomed groove 55$x$ and a bottomed groove 55$y$ that communicate with each other. More particularly, the metal layer 64 includes the bottomed grooves 54$x$ and 55$x$ that open on the side of the metal layer 65. Further, the metal layer 65 includes the bottomed grooves 54$y$ and 55$y$ that open on the side of the metal layer 64. The bottomed grooves 54$x$ and 55$x$, and the bottomed grooves 54$y$ and 55$y$ may have a semi-cylindrical concave shape formed by inner wall surfaces that are curved surfaces, for example.

Cross sectional shapes of the bottomed grooves 54$x$ and 55$x$, and the bottomed grooves 54$y$ and 55$y$, parallel to an XZ-plane, may be an approximately semi-circular shape or an approximately semi-oval shape, for example. The bottomed groove 54$x$ and the bottomed groove 54$y$ have maximum openings of approximately the same width, and are arranged at overlapping positions in the plan view so that the openings face the inner side. For this reason, the opening of the bottomed groove 54$x$ and the opening of the bottomed groove 54$y$ communicate with each other to form the flow passage 54. Similarly, the bottomed groove 55$x$ and the bottomed groove 55$y$ have maximum openings of approximately the same width, and are arranged at overlapping positions in the plan view so that the openings face the inner side. For this reason, the opening of the bottomed groove 55$x$ and the opening of the bottomed groove 55$y$ communicate with each other to foil the flow passage 55.

In other words, the bottomed groove 54$x$ and the bottomed groove 54$y$ are arranged to oppose each other and communicate in the thickness direction (Z-direction), to form the flow passage 54, and the bottomed groove 55$x$ and the bottomed groove 55$y$ are arranged to oppose each other and communicate in the thickness direction, to form the flow passage 55. Cross sectional shapes of the flow passages 54 and 55, parallel to the XZ-plane, may be an approximately semi-circular shape or an approximately semi-oval shape, for example.

The porous body $60D_4$ includes bottomed holes 64$x$, 64$y$, 65$x$, and 65$y$. The metal layer 65 includes a plurality of bottomed holes 65$x$ that cave in from an upper surface side to an approximate center part along the thickness direction, and a plurality of bottomed holes 65$y$ that cave in from a lower surface side to the approximate center part along the thickness direction.

The bottomed holes 65$x$ and the bottomed holes 65$y$ are alternately arranged in the X-direction in the plan view. In addition, the bottomed holes 65$x$ and the bottomed holes 65$y$ are alternately arranged in the Y-direction in the plan view. The bottomed holes 65$x$ and the bottomed holes 65$y$ that are alternately arranged in the X-direction partially overlap in the plan view, and partially overlapping parts of the bottomed hole 65$x$ and the bottomed hole 65$y$ communicate with each other to form a pore 65$z$. Further, the bottomed holes 65$x$ and the bottomed holes 65$y$ that are alternately arranged in the Y-direction partially overlap in the plan view, and overlapping parts of the bottomed hole 65x and the bottomed hole 65y communicate with each other to form a pore 65z. The shapes or the like of the bottomed holes 65x and 65y, and the pore 65z may be similar to the shapes or the like of the bottomed holes 62x and 62y, and the pores 62z, for example.

In addition, the bottomed hole 64y of the metal layer 64 and the bottomed hole 65x of the metal layer 65 partially overlap in the plan view, and overlapping parts of the bottomed hole 64y and the bottomed hole 65x communicate with each other to form a pore 69z.

At least a part of bottomed holes forming the porous body $60D_1$ communicates to the flow passages 51, 52, and 53. In addition, at least a part of bottomed holes forming the porous body $60D_2$ communicates to the flow passages 51, 53, and 54. Further, at least a part of bottomed holes forming the porous body $60D_3$ communicates to the flow passages 52, 53, and 55. At least a part of bottomed holes forming the porous body $60D_4$ communicates to the flow passages 53, 54, and 55. Accordingly, the working fluid C can permeate into the porous bodies $60D_1$, $60D_2$, $60D_3$, and $60C_4$.

As described above, the liquid pipe does not need to have the structure in which four metal layers are successively stacked. For example, the liquid pipe may have the structure in which six metal layers are successively stacked. When forming the liquid pipe by stacking six metal layers, an arbitrary number of flow passages and porous bodies may be provided at an arbitrary number of positions in the metal layers 62 through 65 forming the inner layers.

Sixth Embodiment

In a sixth embodiment, another example of the liquid pipe includes six metal layers that are stacked. A description of constituent elements of the sixth embodiment, that are the same as the constituent elements of the first through fifth embodiments described above, may be omitted.

Figure 11A:
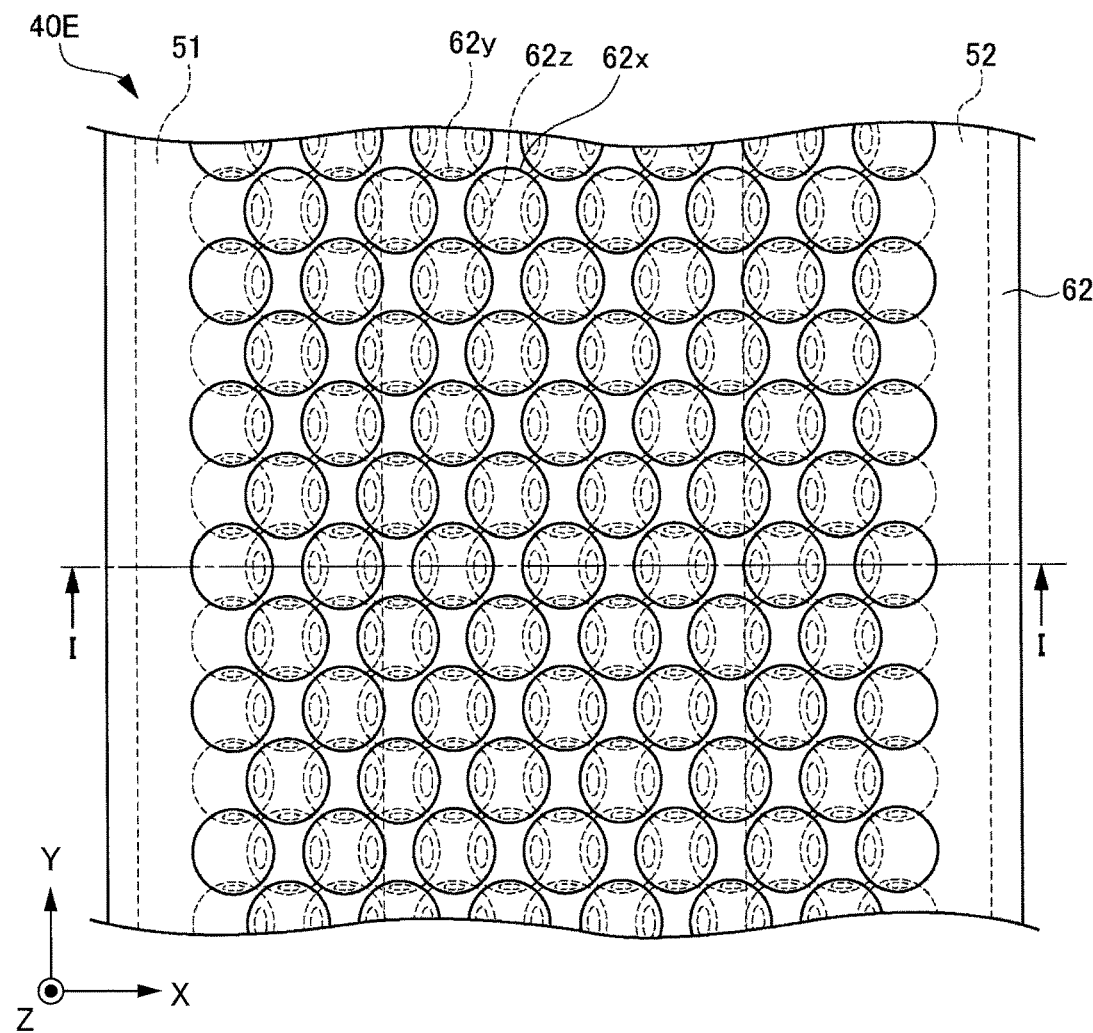
FIG. 11A and FIG. 11B are diagrams illustrating an example of the liquid pipe of the loop heat pipe in a sixth embodiment.
Figure 11B:
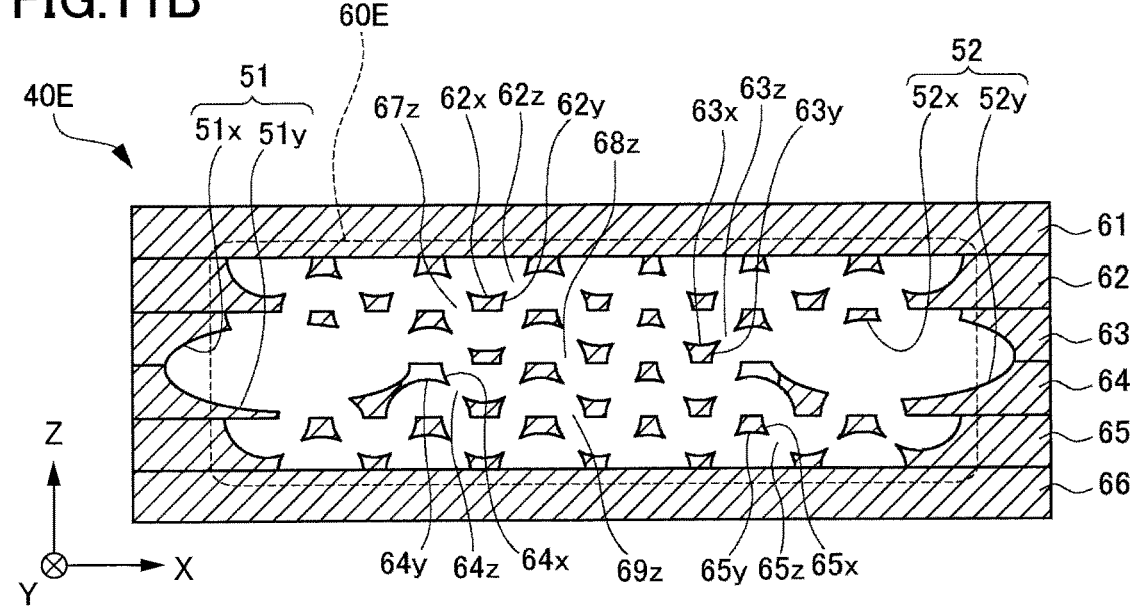

FIG. 11A and FIG. 11B are diagrams illustrating the other example of the liquid pipe of the loop heat pipe in the sixth embodiment. FIG. 11A is a partial enlarged plan view corresponding to FIG. 3A, and FIG. 11B is a cross sectional view along a line I-I in FIG. 11A. FIG. 11A illustrates a planar shape of a porous body 60E within a liquid pipe 40E, and for this reason, the illustration of the metal layer (metal layer 61 illustrated in FIG. 11B) that becomes one of two outermost layers is omitted in FIG. 11A.

As illustrated in FIG. 11B, the liquid pipe 40E has a structure in which six metal layers 61 through 66 are successively stacked, and flow passages 51 and 52, and the porous body 60E are provided in the liquid pipe 40E.

The porous body 60E is provided in the metal layers 62 through 66 of the liquid pipe 40E. The porous body 60E includes the bottomed holes 62x and 62y provided in the metal layer 62, the bottomed holes 63x and 63y provided in the metal layer 63, the bottomed holes 64x and 64y provided in the metal layer 64, and the bottomed holes 65x and 65y provided in the metal layer 65. The arrangements of each of the bottomed holes of the metal layers 62 through 66 may be the same as in the liquid pipes 40 through 40D described above.

The flow passages 51 and 52 are provided in the metal layers 63 and 64 of the liquid pipe 40E. The flow passages 51 and 52 may have the structure described above in conjunction with FIG. 3A and FIG. 3B.

At least a part of bottomed holes forming the porous body 60E communicates to the flow passages 51 and 52. Accordingly, the working fluid C can permeate into the porous body 60E. In addition, because the porous body 60E is also provided approximately at a center part of the liquid pipe 40E, the porous body 60E also functions as a column. As a result, it is possible to prevent the liquid pipe 40E from collapsing due to pressure during the solid-phase bonding, for example.

As described above, the liquid pipe does not need to have the structure in which four metal layers are successively stacked. For example, the liquid pipe may have the structure in which six metal layers are successively stacked. When forming the liquid pipe by stacking six metal layers, an arbitrary number of flow passages and porous bodies may be provided at an arbitrary number of positions in the metal layers 62 through 65 forming the inner layers.

(First Modification)

In a first modification, an example of the liquid pipe includes a plurality of pores are provided with respect to one bottomed hole. A description of constituent elements of the first modification, that are the same as the constituent elements of the first through sixth embodiments described above, may be omitted.

Figure 12:
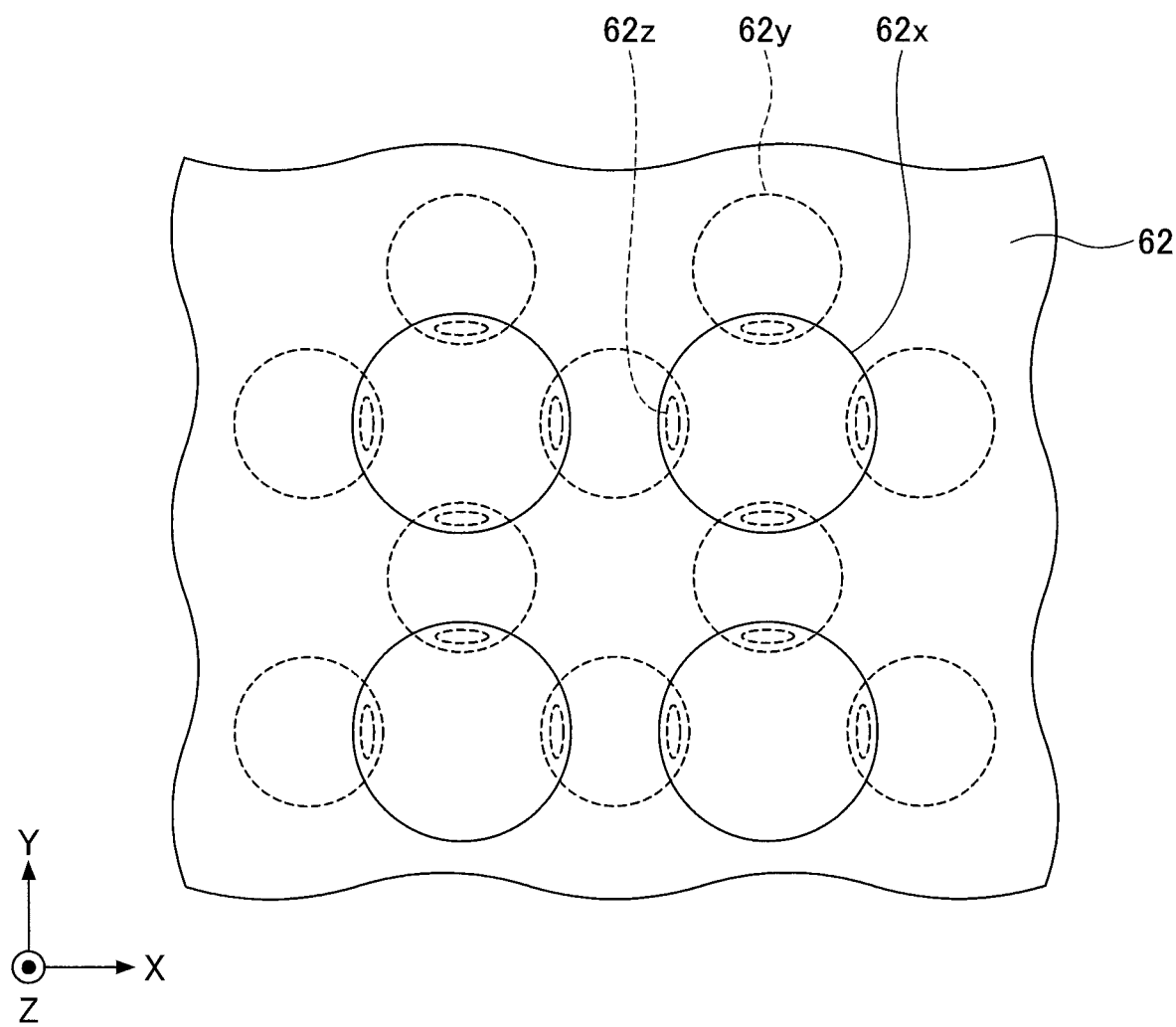
FIG. 12 is a diagram illustrating an example that provides a plurality of pores with respect to one bottomed hole.

FIG. 12 is a diagram illustrating the example that provides the plurality of pores with respect to one bottomed hole. As illustrated in FIG. 12, the size of the bottomed hole 62x is made larger than the size of the bottomed hole 62y, and the plurality of bottomed holes 62y may be arranged in a periphery of the bottomed hole 62x.

By making the size of a part of the bottomed holes large, a spatial volume becomes large, to reduce the pressure loss of the working fluid C flowing within the bottomed holes.

Although the example is described for the metal layer 62, a structure similar to the structure of the metal layer 62 described in conjunction with FIG. 12 may be employed in each of the metal layers 63 through 65.

In addition, the first modification may be applied to each of the first through sixth embodiments.

(Second Modification)

In a second modification, an example of the liquid pipe includes a porous body having grooves in addition to the bottomed holes. A description of constituent elements of the second modification, that are the same as the constituent elements of the first through sixth embodiments described above, may be omitted.

Figure 13:
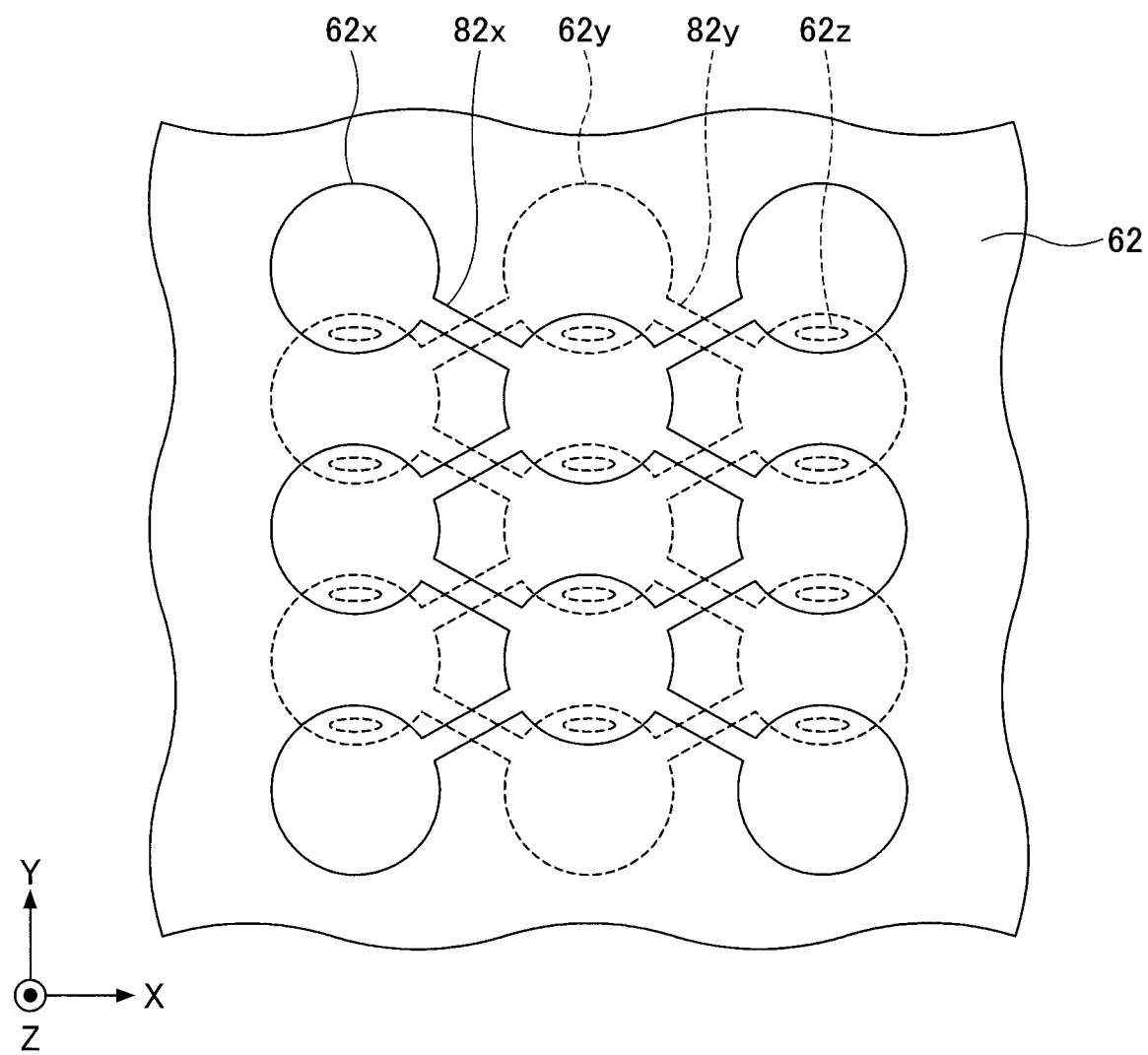
FIG. 13 is a diagram illustrating an example that provides bottomed holes and grooves in one metal layer.

FIG. 13 is a diagram illustrating the example that provides bottomed holes and grooves in one metal layer. As illustrated in FIG. 13, a plurality of grooves 82x that cave in from the upper surface side to the approximate center part, and a plurality of grooves 82y that cave in from the lower surface side to the approximate center part, may be provided in the metal layer 62, for example. In FIG. 13, one groove 82x communicates the adjacent bottomed holes 62x to each other, and one groove 82y communicates the adjacent bottomed holes 62y to each other. The grooves 82x and 82y may be formed by half-etching, similarly the half-etching of the bottomed holes. The groove 82x does not communicate to the groove 82y.

By communicating the adjacent bottomed holes via the groove, it is possible to assist the permeability of the working fluid C. The effect of assisting the permeability of the working fluid C can be obtained to a certain extent, even in a case in which only one of the grooves 82x and the grooves 82y are provided.

Although the example is described for the metal layer 62, a structure similar to the structure of the metal layer 62 described in conjunction with FIG. 13 may be employed in each of the metal layers 63 through 65.

In addition, the second modification may be applied to each of the first through sixth embodiments.

According to each of the embodiments described above, it is possible to provide a loop heat pipe, and a method of manufacturing the loop heat pipe, which can reduce the deterioration in the heat transfer performance of the loop heat pipe.

Various aspects of the subject-matter described herein may be set out non-exhaustively in the following numbered clauses:

1. A method of manufacturing a loop heat pipe that includes an evaporator configured to vaporize a working fluid, a condenser configured to liquefy the working fluid, a liquid pipe configured to connect the evaporator and the condenser, and a vapor pipe configured to connect the evaporator and the condenser, wherein the liquid pipe includes two metal layers forming outermost layers, and two or more metal layers that form inner layers stacked between the outer layers, and the inner layers are provided with one or more flow passages in which the working fluid flows, and a porous body communicating with the one or more flow passages, the method comprising:

forming the one or more flow passages in the inner layers, wherein the foisting the one or more flow passages includes
half-etching a first metal sheet to form a first bottomed groove,
half-etching a second metal sheet to form a second bottomed groove, and
stacking the first metal sheet and the second metal sheet so that an opening side of the first bottomed groove and an opening side of the second bottomed groove oppose each other, to form a flow passage in which the first bottomed groove and the second bottomed groove communicate with each other in a thickness direction.

2. The method of manufacturing the loop heat pipe according to clause 1, wherein
the half-etching the first metal sheet includes formi forming a plurality of bottomed grooves, arranged in the one metal layer, and opening on the side of the other metal layer and communicating in a plane direction,
the half-etching the second metal sheet includes forming a plurality of bottomed grooves, arranged in the other metal layer, and opening on the side of the one metal layer and communicating in the plane direction, and
the forming the one or more flow passages form a flow passage by the plurality of bottomed grooves arranged in the one metal layer, and the plurality of bottomed grooves arranged in the other metal layer that are arranged to oppose and communicate with each other in the thickness direction.

3. The method of manufacturing the loop heat pipe according to clause 1, wherein the forming the one or more flow passages forms two flow passages arranged on both sides of the porous body in the one metal layer and the other metal layer, respectively.

4. The method of manufacturing the loop heat pipe according to clause 1, wherein the bottomed grooves forming the one or more flow passages have a semi-cylindrical concave shape formed by inner wall surfaces that are curved surfaces.

5. The method of manufacturing the loop heat pipe according to clause 1, further comprising:
forming the porous body in at least one metal layer forming the inner layers,
wherein the forming the porous body forms the porous body to include a first bottomed hole that caves in from one surface side of the at least one metal layer, a second bottomed hole that caves in from another surface side of the at least one metal layer, and a pore formed by the first bottomed hole and the second bottomed hole that partially communicate with each other.

Although the embodiments and modifications are numbered with, for example, "first," "second," etc., the ordinal numbers do not imply priorities of the embodiments and modifications. Many other variations and modifications will be apparent to those skilled in the art.

For example, the arrangement of the bottomed holes is not limited to those of the embodiments and modifications described above in conjunction with the plan views, and various variations and modifications of the arrangement of the bottomed holes are possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A loop heat pipe comprising:
an evaporator configured to vaporize a working fluid;
a condenser configured to liquefy the working fluid;
a liquid pipe configured to connect the evaporator and the condenser; and
a vapor pipe configured to connect the evaporator and the condenser and form a loop-shaped passage,
wherein the liquid pipe includes a first metal layer and a second metal layer respectively forming outermost layers, and a third metal layer and a fourth metal layer that are stacked along a thickness direction of the loop heat pipe and make contact with each other and form inner layers stacked between the outermost layers,
wherein the inner layers are provided with one or more flow passages in which the working fluid flows, and a porous body communicating with the one or more flow passages,
wherein all the third metal layer includes a first bottomed groove closed on one side along the thickness direction and opening to an opposite side along the thickness direction toward the fourth metal layer,
wherein the fourth metal layer includes a second bottomed groove closed on one side along the thickness direction and opening to an opposite side along the thickness direction toward the third metal layer, and
wherein the one or more flow passages include a flow passage formed by the first bottomed groove and the second bottomed groove that are arranged to oppose and communicate with each other in the thickness direction.

2. The loop heat pipe as claimed in claim 1, wherein
the first bottomed groove includes a plurality of bottomed grooves, arranged in the third metal layer, opening toward the fourth metal layer, and communicating with each other in a plane direction perpendicular to the thickness direction,
the second bottomed groove includes a plurality of bottomed grooves, arranged in the fourth metal layer, opening toward the third metal layer, and communicating with each other in the plane direction, and the one or more flow passages include a flow passage formed by the plurality of bottomed grooves arranged in the third metal layer, and the plurality of bottomed grooves arranged in the fourth metal layer, that are arranged to oppose and communicate with each other in the thickness direction.

3. The loop heat pipe as claimed in claim 1, wherein the one or more flow passages include two flow passages arranged on both sides, along a plane direction perpendicular to the thickness direction, of the porous body in the third metal layer and the fourth metal layer, respectively.

4. The loop heat pipe as claimed in claim 1, wherein
the inner layers include a fifth metal layer stacked on and in contact with the fourth metal layer,
the fourth metal layer includes a third bottomed groove closed on one side along the thickness direction and opening to an opposite side along the thickness direction toward the fifth metal layer,
the fifth metal layer includes a fourth bottomed groove closed on one side along the thickness direction and opening on an opposite side along the thickness direction toward the fourth metal layer, and
the one or more flow passages include a flow passage formed by the third bottomed groove and the fourth bottomed groove that are arranged to oppose and communicate with each other in the thickness direction.

5. The loop heat pipe as claimed in claim 4, wherein the porous body is provided in the third metal layer, the fourth metal layer, and the fifth metal layer.

6. The loop heat pipe as claimed in claim 4, wherein
the inner layers include a sixth metal layer stacked on and in contact with the fifth metal layer,
the fifth metal layer includes a fifth bottomed groove closed on one side along the thickness direction and opening to an opposite side along the thickness direction toward the sixth metal layer,
the sixth metal layer includes a six bottomed groove closed on one side along the thickness direction and opening on an opposite side along the thickness direction toward the fifth metal layer, and
the one or more flow passages include a flow passage formed by the fifth bottomed groove and the sixth bottomed groove that are arranged to oppose and communicate with each other in the thickness direction.

7. The loop heat pipe as claimed in claim 6, wherein the porous body is provided in the third metal layer, the fourth metal layer, the fifth metal layer, and the sixth metal layer.

8. The loop heat pipe as claimed in claim 1, wherein the first and second bottomed grooves forming the one or more flow passages have a semi-cylindrical concave shape formed by inner wall surfaces that are curved surfaces.

9. The loop heat pipe as claimed in claim 1, wherein
the porous body is formed in at least one metal layer forming the inner layers, and
the porous body includes a first bottomed hole that caves in from a first surface of the at least one metal layer along the thickness direction, a second bottomed hole that caves in from a second surface of the at least one metal layer opposite to the first surface along the thickness direction, and a pore formed by the first bottomed hole and the second bottomed hole that communicate with each other by partially overlapping in a plan view.

10. The loop heat pipe as claimed in claim 1, wherein each of the first metal layer and the second metal layer forming the outermost layers is a continuous layer having no holes nor grooves.

11. The loop heat pipe as claimed in claim 1, wherein
the first bottomed groove opens toward the fourth metal layer with a first opening area in a plan view,
the second bottomed groove opens toward the third metal layer with a second opening area in the plan view,
the first bottomed groove and the second bottomed groove overlap and communicate with each other in the plan view, and
the first opening area and the second opening area are identical at a position forming a flow passage.

12. The loop heat pipe as claimed in claim 11, wherein the first and second bottomed grooves forming the one or more flow passages have a semi-cylindrical concave shape formed by inner wall surfaces that are curved surfaces.

13. The loop heat pipe as claimed in claim 2, wherein
the plurality of bottomed grooves included in the first bottomed groove partially overlap in a plan view, and
the plurality of bottomed grooves included in the second bottomed groove partially overlap in the plan view.

14. The loop heat pipe as claimed in claim 9, wherein
the porous body is formed in at least one metal layer forming the inner layers, and
the porous body includes
a first bottomed hole that caves in along the thickness direction from a first surface of the third metal layer,
a second bottomed hole that caves in along the thickness direction from a second surface of the third metal layer opposite to the first surface,
a first pore formed by the first bottomed hole and the second bottomed hole that communicate with each other by partially overlapping in a plan view,
a third bottomed hole that caves in along the thickness direction from a third surface of the fourth metal layer, in contact with the second surface of the third metal layer,
a fourth bottomed hole that caves in along the thickness direction from a fourth surface of the fourth metal layer opposite to the third surface, and
a second pore formed by the third bottomed hole and the fourth bottomed hole that communicate with each other by partially overlapping in a plan view,
wherein the second bottomed hole opens toward the fourth metal layer with a first opening area in the plan view,
wherein the third bottomed hole opens toward the third metal layer with a second opening area in the plan view,
wherein the second bottomed hole and the third bottomed hole partially overlap and communicate with each other via a third opening area in the plan view, and
wherein the third opening area is smaller than each of the second opening area and the third opening area at a position forming a third pore.

15. The loop heat pipe as claimed in claim 14, wherein the first and second bottomed holes forming the first pore, and the third and fourth bottomed holes forming the second pore, respectively have a semi-cylindrical concave shape formed by inner wall surfaces that are curved surfaces.

16. The loop heat pipe as claimed in claim 14, wherein
the first bottomed hole includes a plurality of bottomed holes partially overlapping in the plan view along a first direction parallel to a plane direction that is perpendicular to the thickness direction, and
the second bottomed hole includes a plurality of bottomed holes partially overlapping in the plan view along a second direction, perpendicular to the first direction, and parallel to the plane direction.

17. The loop heat pipe as claimed in claim 16, wherein the third metal layer includes
- a first groove that communicates two mutually adjacent bottomed holes among the plurality of bottomed holes included in the first bottomed hole, and
- a second groove that communicates two mutually adjacent bottomed holes among the plurality of bottomed holes included in the second bottomed hole.

\* \* \* \* \*